United States Patent
Lai et al.

(10) Patent No.: US 11,837,603 B2
(45) Date of Patent: Dec. 5, 2023

(54) EXTENDED SIDE CONTACTS FOR TRANSISTORS AND METHODS FORMING SAME

(71) Applicant: Taiwan Semiconductor Manufacturing Co., Ltd., Hsinchu (TW)

(72) Inventors: Ying-Yu Lai, Taipei (TW); Chih-Hsuan Lin, Hsinchu (TW); Hsi Chung Chen, Tainan (TW); Chih-Teng Liao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/332,495

(22) Filed: May 27, 2021

(65) Prior Publication Data
US 2022/0238522 A1 Jul. 28, 2022

Related U.S. Application Data

(60) Provisional application No. 63/140,277, filed on Jan. 22, 2021.

(51) Int. Cl.
*H01L 27/092* (2006.01)
*H01L 21/8234* (2006.01)
(Continued)

(52) U.S. Cl.
CPC .. *H01L 27/0924* (2013.01); *H01L 21/823418* (2013.01); *H01L 21/823431* (2013.01);
(Continued)

(58) Field of Classification Search
CPC ......... H01L 27/0924; H01L 21/823418; H01L 21/823431; H01L 29/0653; H01L 29/66795; H01L 29/7851
See application file for complete search history.

(56) References Cited

U.S. PATENT DOCUMENTS

| 9,960,256 B2 | 5/2018 | Bouche et al. |
| 10,665,692 B2 | 5/2020 | Xie et al. |

(Continued)

FOREIGN PATENT DOCUMENTS

| CN | 110416210 A | 11/2019 |
| CN | 110620110 A | 12/2019 |

(Continued)

*Primary Examiner* — Karen Kusumakar
*Assistant Examiner* — Adam S Bowen
(74) *Attorney, Agent, or Firm* — Slater Matsil, LLP

(57) ABSTRACT

A method includes forming a source/drain region for a transistor, forming a first inter-layer dielectric over the source/drain region, and forming a lower source/drain contact plug over and electrically coupling to the source/drain region. The lower source/drain contact plug extends into the first inter-layer dielectric. The method further includes depositing an etch stop layer over the first inter-layer dielectric and the lower source/drain contact plug, depositing a second inter-layer dielectric over the etch stop layer, and performing an etching process to etch the second inter-layer dielectric, the etch stop layer, and an upper portion of the first inter-layer dielectric to form an opening, with a top surface and a sidewall of the lower source/drain contact plug being exposed to the opening, and forming an upper source/drain contact plug in the opening.

20 Claims, 24 Drawing Sheets

(51) Int. Cl.
 *H01L 29/06* (2006.01)
 *H01L 29/66* (2006.01)
 *H01L 29/78* (2006.01)

(52) U.S. Cl.
 CPC .... *H01L 29/0653* (2013.01); *H01L 29/66795* (2013.01); *H01L 29/7851* (2013.01)

(56) References Cited

U.S. PATENT DOCUMENTS

| | | |
|---|---|---|
| 10,833,160 B1 | 11/2020 | Aquilino et al. |
| 10,903,324 B2 | 1/2021 | Noh et al. |
| 11,075,279 B2 | 7/2021 | Liao et al. |
| 11,101,353 B2 | 8/2021 | Huang et al. |
| 11,417,652 B2 | 8/2022 | Lee et al. |
| 2013/0082393 A1* | 4/2013 | Kawamura ....... H01L 23/53266 257/773 |
| 2018/0301371 A1* | 10/2018 | Wang .................. H01L 29/7851 |
| 2019/0371664 A1* | 12/2019 | Wu ..................... H01L 21/7684 |
| 2021/0057533 A1* | 2/2021 | Hwang ............... H01L 23/5226 |

FOREIGN PATENT DOCUMENTS

| | | |
|---|---|---|
| TW | 201816859 A | 5/2018 |
| TW | 202040749 A | 11/2020 |

\* cited by examiner

EXTENDED SIDE CONTACTS FOR TRANSISTORS AND METHODS FORMING SAME

PRIORITY CLAIM AND CROSS-REFERENCE

This application claims the benefit of the following provisionally filed U.S. patent application: Application No. 63/140,277, filed on Jan. 22, 2021, and entitled "VD Tiger Tooth for Device Performance Improvement," which application is hereby incorporated herein by reference.

BACKGROUND

In the manufacturing of integrated circuits, contact plugs are used for electrically coupling to the source and drain regions and the gates of transistors. The source/drain contact plugs were typically connected to source/drain silicide regions, whose formation processes include forming contact openings to expose source/drain regions, depositing a metal layer, depositing a barrier layer over the metal layer, performing an anneal process to react the metal layer with the source/drain regions, filling a metal into the remaining contact opening, and performing a Chemical Mechanical Polish (CMP) process to remove excess metal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
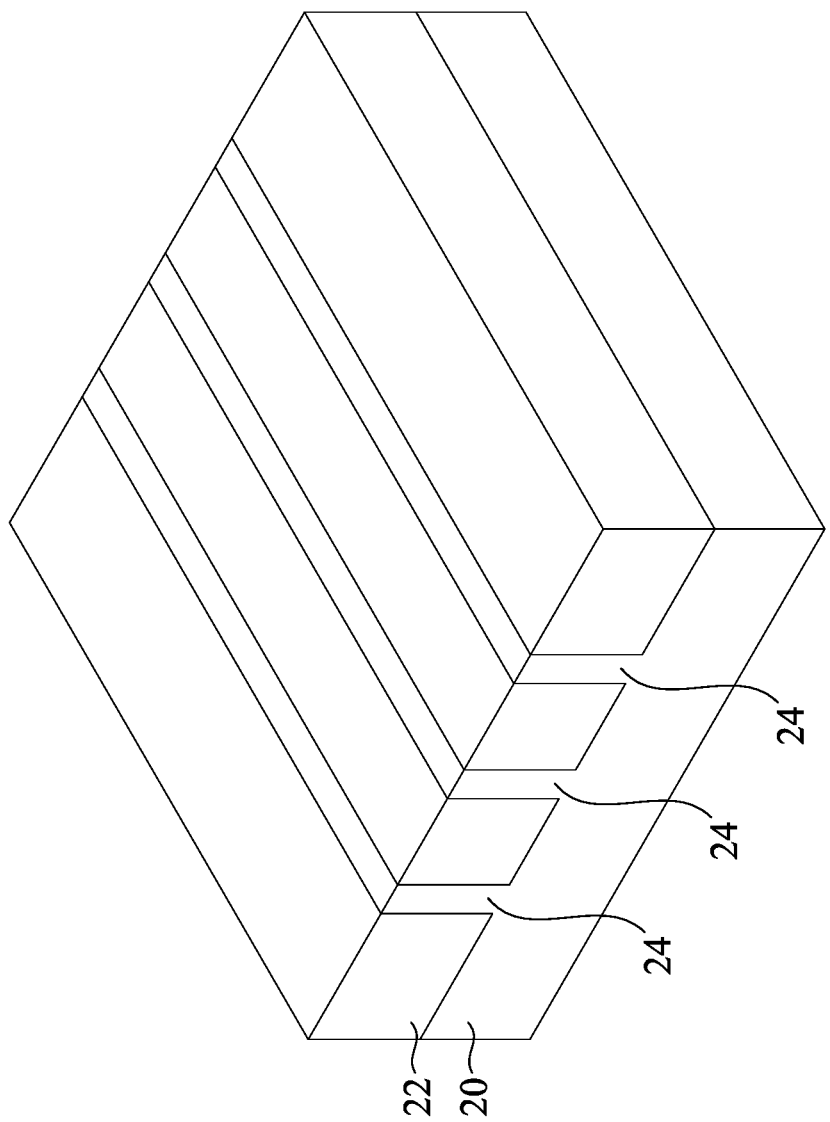
FIGS. 1-7, 8A, 8B, 9A, 9B, 10A, 10B, and 11-20 are perspective views and cross-sectional views of intermediate stages in the formation of a transistor and the respective contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A contact plug with both of a top contact and a side contact to the underlying conductive features and the method of forming the same are provided. In accordance with some embodiments, a lower source/drain contact plug is formed in a first inter-layer dielectric, and a second inter-layer dielectric is formed over the first inter-layer dielectric. An upper source/drain contact plug is then formed in the second inter-layer dielectric. In the etching of the inter-layer dielectric for forming a contact opening for the upper source/drain contact plug, the contact opening is intentionally vertically offset from the lower source/drain contact plug, and a portion of the first inter-layer dielectric is etched. The sidewall portion (including a diffusion barrier) of the lower source/drain contact plug is etched. Accordingly, the upper source/drain contact plug, in addition to contacting the top surface of the lower source/drain contact plug, also contacts the sidewall of the lower source/drain contact plug. The adhesion between the upper source/drain contact plug and the lower source/drain contact plug is thus improved, and contact resistance is reduced. It is appreciated that although a Fin Field-Effect Transistor (FinFET) is used as an example, other types of transistors such as planar transistors, Gate-All-Around (GAA) transistors, or the like, may also adopt the embodiments of the present disclosure. Furthermore, although source/drain contact plugs are used as examples, other conductive features including, and not limited to, conductive lines, conductive plugs, conductive vias, and the like may also adopt the embodiments of the present disclosure. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-7, 8A, 8B, 9A, 9B, 10A, 10B, and 11-20 illustrate the perspective views and cross-sectional views of intermediate stages in the formation of a Fin Field-Effect Transistor (FinFET) and the corresponding contact plugs in accordance with some embodiments of the present disclosure. The corresponding processes are also reflected schematically in the process flow 200 as shown in FIG. 21.

FIG. 1 illustrates a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 shown in FIG. 21. The portions of substrate 20 between neighboring STI regions 22 are referred to as semiconductor strips 24. The top surfaces of semiconductor strips 24 and the top surfaces of STI regions 22 may be substantially level with each other. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to grow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include an oxide layer lining semiconductor strips 24 (not shown), which may be a thermal oxide layer formed through the thermal oxidation of a surface layer of substrate 20. The oxide layer may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the oxide layer, wherein the dielectric material may be formed using Flowable Chemical Vapor Deposition (FCVD), spin-on coating, or the like.

Figure 2:
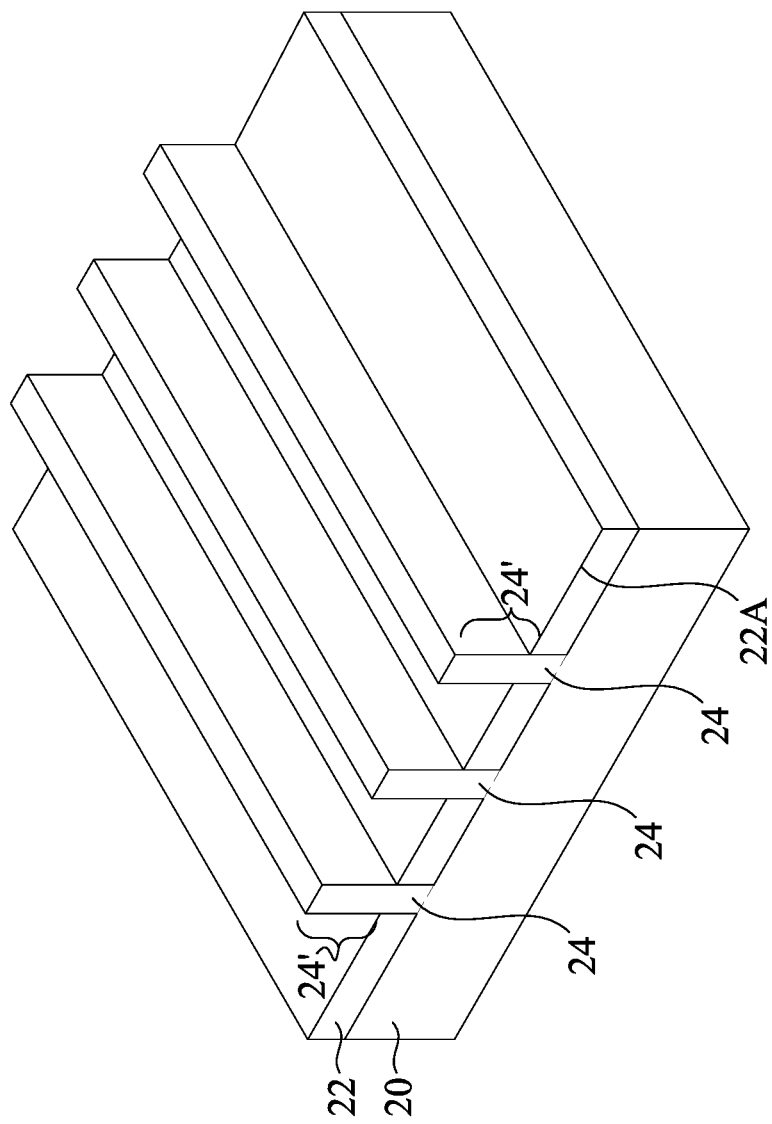

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 204 in the process flow 200 shown in FIG. 21. The etching may be performed using a dry etching process, for example, using $NF_3$ and $NH_3$ as the etching gases. In accordance with alternative embodiments of the present disclosure, the recessing of STI regions 22 is performed using a wet etching process. The etching chemical may include diluted HF solution, for example.

In above-illustrated embodiments, the semiconductor strips may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
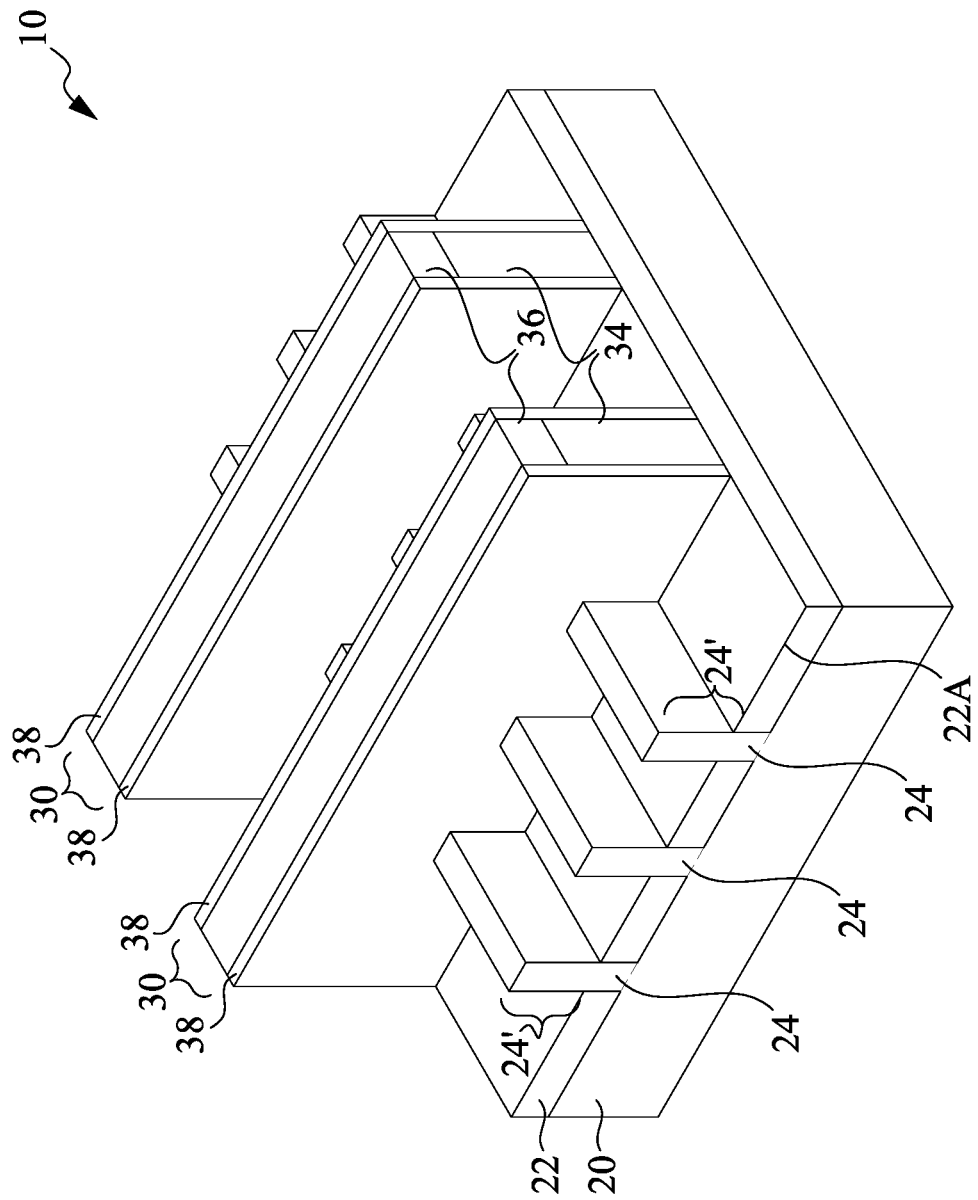

Referring to FIG. 3, dummy gate stacks 3o are formed to extend on the top surfaces and the sidewalls of (protruding) fins 24'. The respective process is illustrated as process 206 in the process flow 200 shown in FIG. 21. Dummy gate stacks 3o may include dummy gate dielectrics (not shown) on sidewalls of protruding fins 24', and dummy gate electrodes 34 over the respective dummy gate dielectrics. The dummy gate dielectrics may comprise silicon oxide. Dummy gate electrodes 34 may be formed, for example, using polysilicon, and other materials may also be used. Each of dummy gate stacks 3o may also include one (or a plurality of) hard mask layer 36 over the corresponding dummy gate electrodes 34. Hard mask layers 36 may be formed of silicon nitride, silicon oxide, silicon oxy-nitride, or multi-layers thereof. Dummy gate stacks 3o may cross over a single one or a plurality of protruding fins 24' and/or STI regions 22. Dummy gate stacks 3o also have lengthwise directions perpendicular to the lengthwise directions of protruding fins 24'.

Next, gate spacers 38 are formed on the sidewalls of dummy gate stacks 30. The respective process is also illustrated as process 206 in the process flow 200 shown in FIG. 21. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
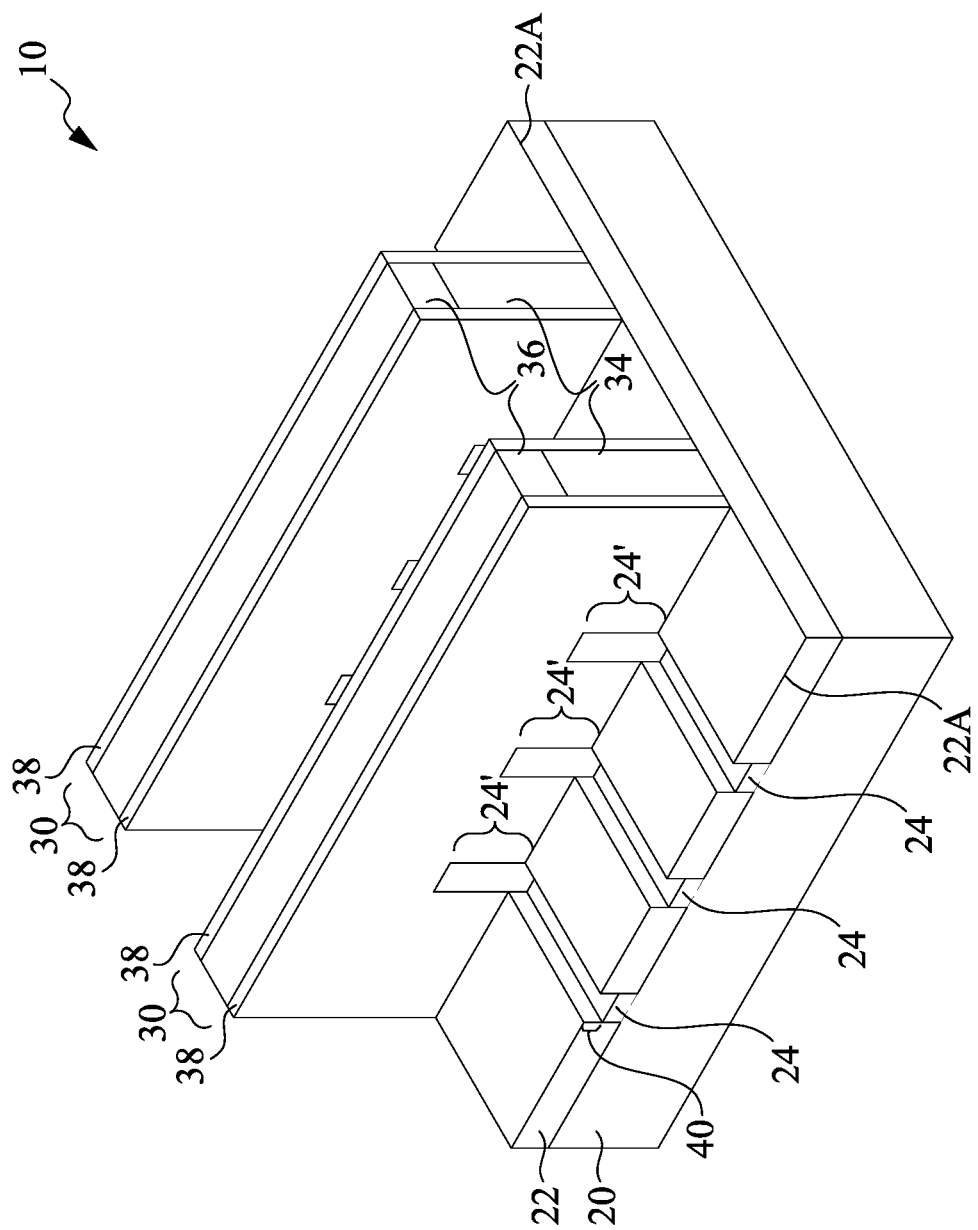

An etching process is then performed to etch the portions of protruding fins 24' that are not covered by dummy gate stack 30 and gate spacers 38, resulting in the structure shown in FIG. 4. The respective process is illustrated as process 208 in the process flow 200 shown in FIG. 21. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched protruding fins 24' and semiconductor strips 24 are referred to as recesses 40. Recesses 40 are located on the opposite sides of dummy gate stacks 30.

Figure 5:
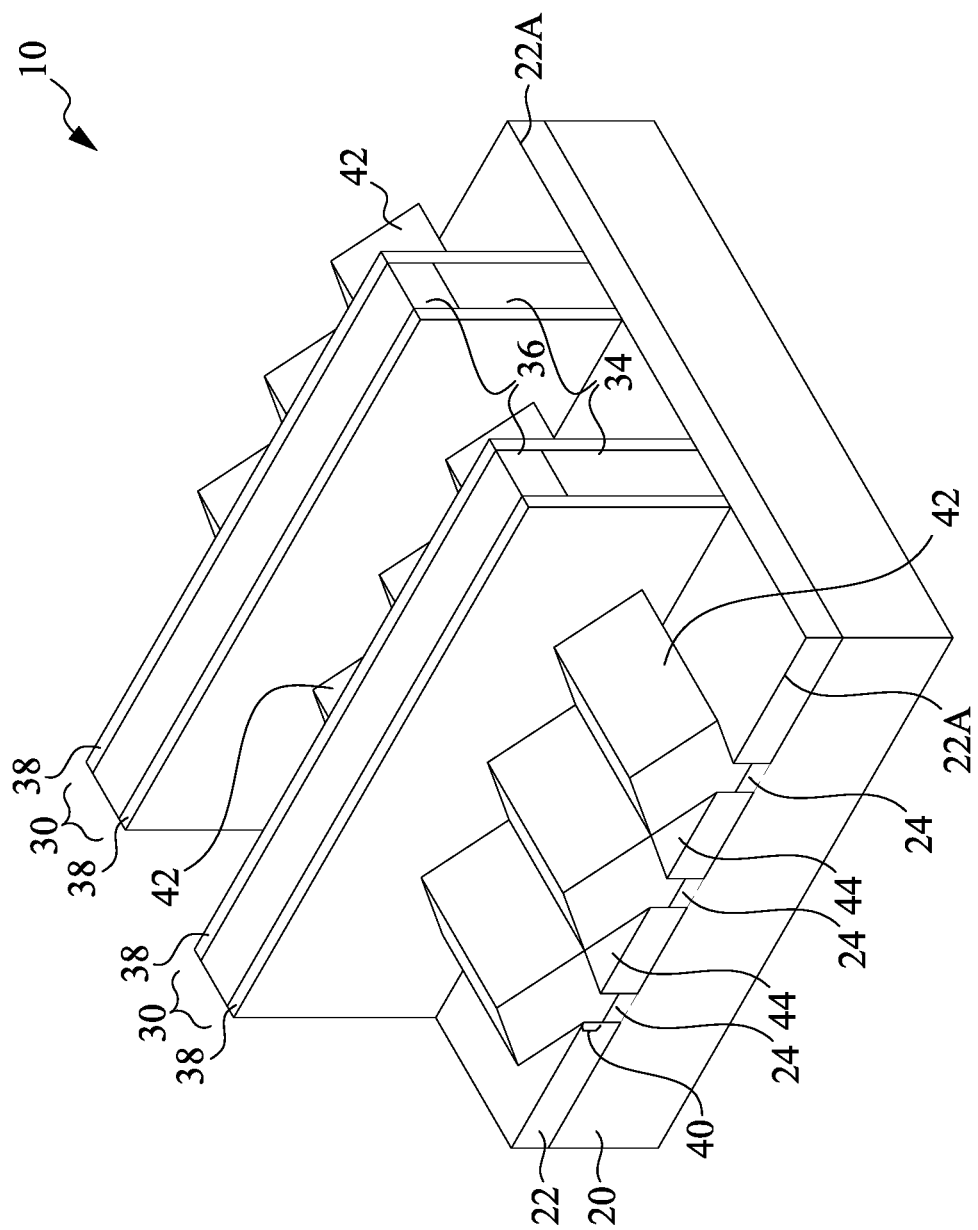
Figure 6:
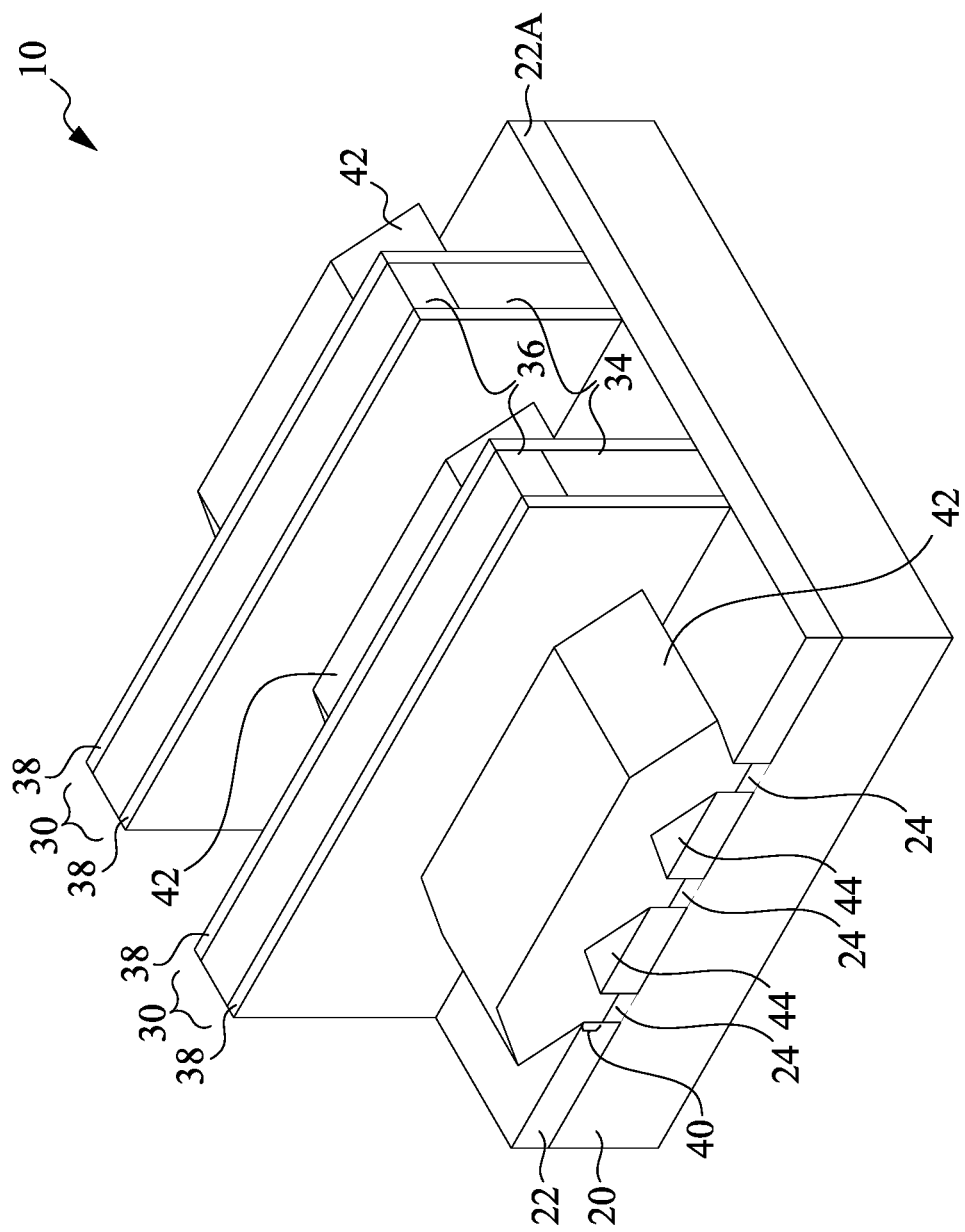

Next, as shown in FIG. 5, epitaxy regions (source/drain regions) 42 are formed by selectively growing (through epitaxy) a semiconductor material in recesses 40. The respective process is illustrated as process 210 in the process flow 200 shown in FIG. 21. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. After Recesses 40 are filled with epitaxy regions 42, the further epitaxial growth of epitaxy regions 42 causes epitaxy regions 42 to expand horizontally, and facets may be formed. The further growth of epitaxy regions 42 may also cause neighboring epitaxy regions 42 to merge with each other. Voids (air gaps) 44 may be generated. In accordance with some embodiments of the present disclosure, the formation of epitaxy regions 42 may be finished when the top surface of epitaxy regions 42 is still wavy, or when the top surface of the merged epitaxy regions 42 has become planar, which is achieved by further growing on the epitaxy regions 42 as shown in FIG. 6.

After the epitaxy process, epitaxy regions 42 may be further implanted with a p-type or an n-type impurity to form source and drain regions, which are also denoted using reference numeral 42. In accordance with alternative embodiments of the present disclosure, the implantation process is skipped when epitaxy regions 42 are in-situ doped with the p-type or n-type impurity during the epitaxy.

Figure 7:
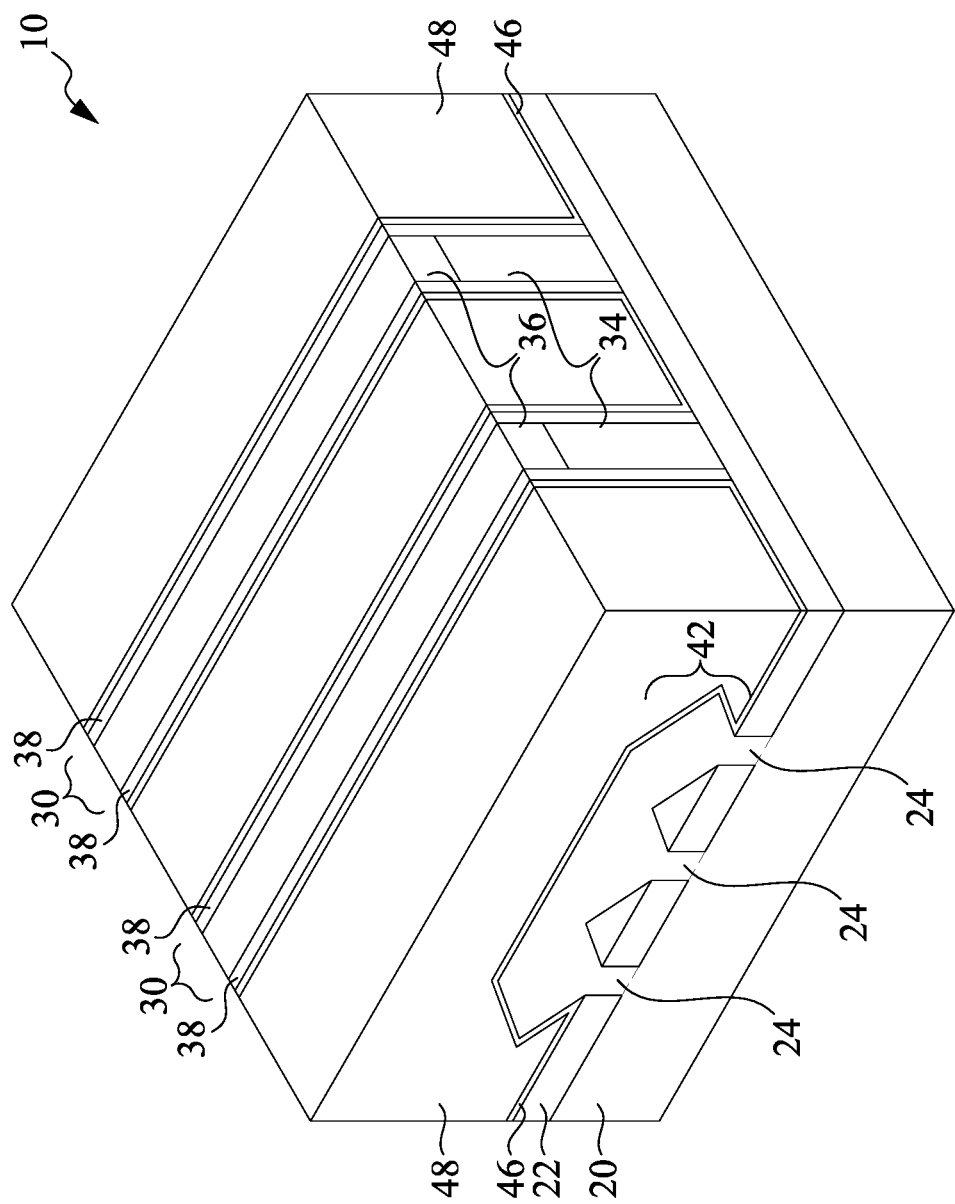

FIG. 7 illustrates a perspective view of the structure after the formation of Contact Etch Stop Layer (CESL) 46 and Inter-Layer Dielectric (ILD) 48. The respective process is illustrated as process 212 in the process flow 200 shown in FIG. 21. CESL 46 may be formed of silicon oxide, silicon nitride, silicon carbo-nitride, or the like, and may be formed using CVD, ALD, or the like. ILD 48 may include a dielectric material formed using, for example, FCVD, spin-on coating, CVD, or another deposition process. ILD 48 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Figure 8A:
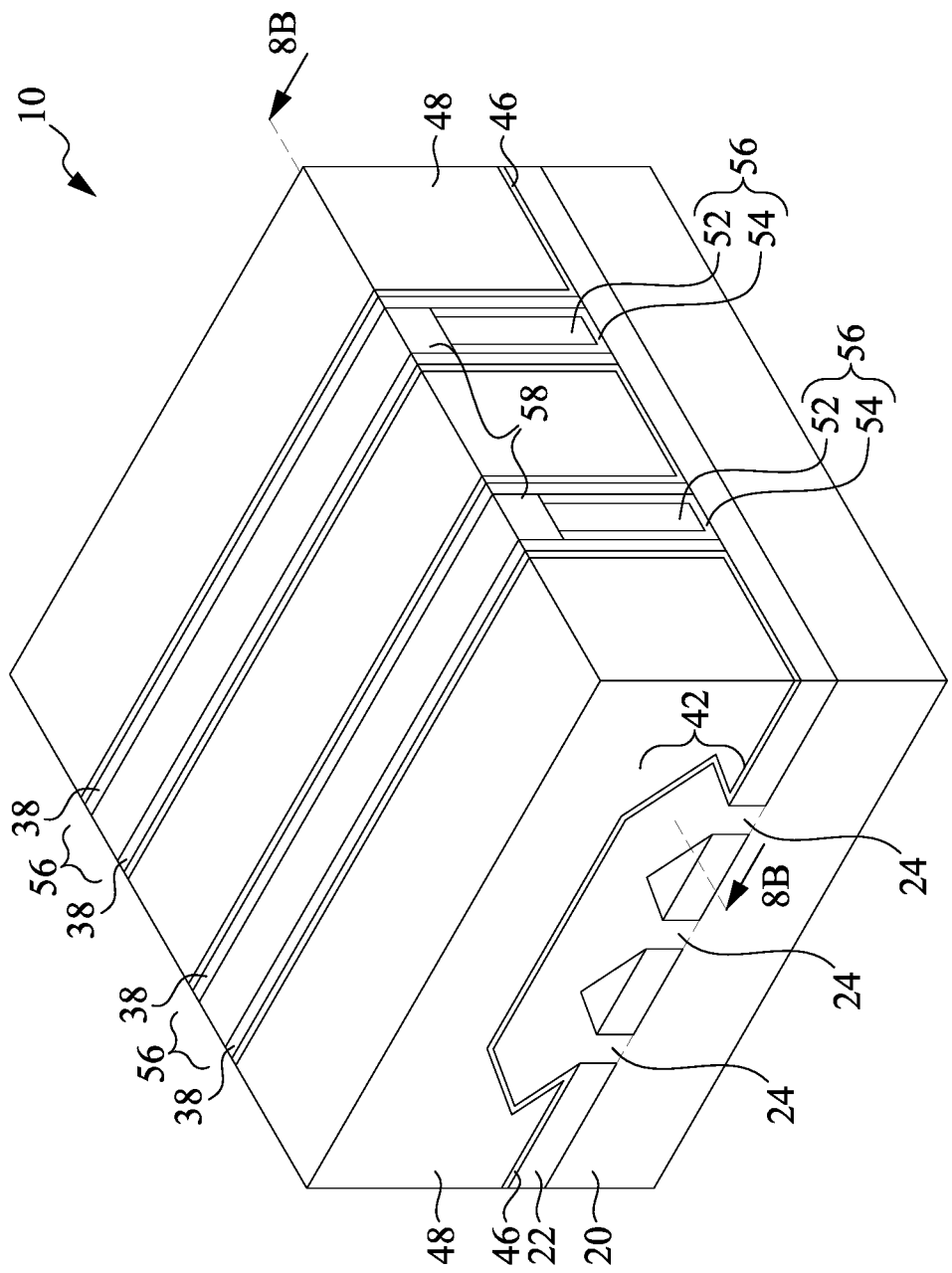
Figure 8B:
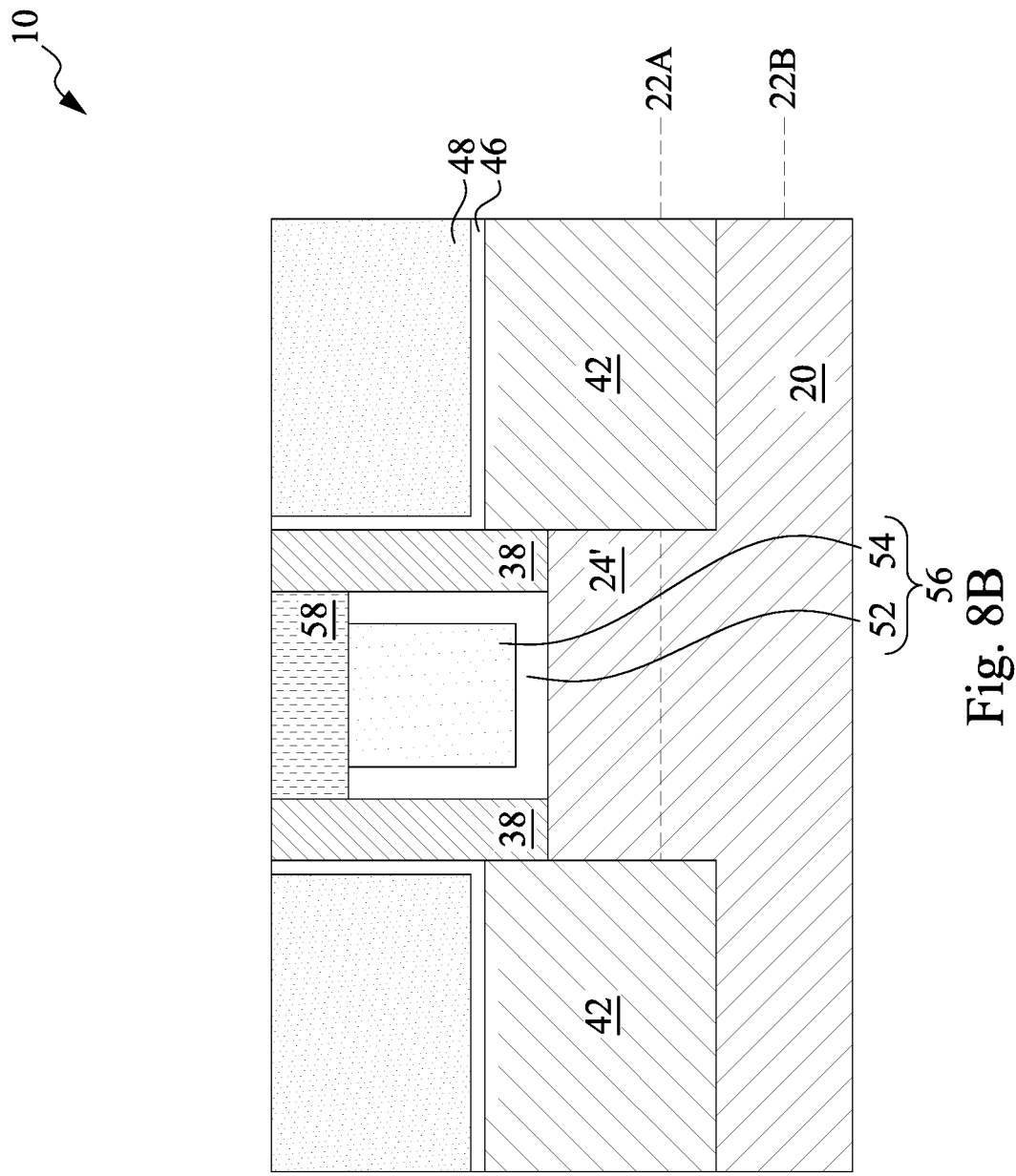

Next, dummy gate stacks 3o, which include hard mask layers 36, dummy gate electrodes 34, and the dummy gate dielectrics are replaced with replacement gate stacks 56, which include metal gate electrodes 54 and gate dielectrics 52 as shown in FIGS. 8A and 8B. The positions of the top surface 22A and the bottom surface 22B of the STI regions 22 are indicated by dashed lines in FIG. 8B. The respective process is illustrated as process 214 in the process flow 200 shown in FIG. 21. When forming replacement gate stacks 56, hard mask layers 36, dummy gate electrodes 34 (as shown in FIG. 7), and the dummy gate dielectrics are first removed in one or a plurality of etching processes, resulting in trenches/openings to be formed between gate spacers 38. The top surfaces and the sidewalls of protruding semiconductor fins 24' are exposed to the resulting trenches.

Next, as shown in FIGS. 8A and 8B, which illustrate a perspective view and a cross-sectional view, respectively, replacement gate dielectrics 52 are formed, which extend into the trenches between gate spacers 38. FIG. 8B illustrates the reference cross-section 8B-8B in FIG. 8A. In accordance with some embodiments of the present disclosure, each of gate dielectrics 52 includes an Interfacial Layer (IL) as its lower part, which contacts the exposed surfaces of the corresponding protruding fins 24'. The IL may include an oxide layer such as a silicon oxide layer, which is formed through the thermal oxidation of protruding fins 24', a chemical oxidation process, or a deposition process. Gate dielectric 52 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIGS. 8A and 8B, gate electrodes 54 are formed over gate dielectrics 52. Gate electrodes 54 include stacked conductive layers. The stacked conductive layers are not shown separately, while the stacked conductive layers may be distinguishable from each other. The deposition of the stacked conductive layers may be performed using a conformal deposition method(s) such as ALD or CVD. The stacked conductive layers may include a diffusion barrier layer (also sometimes referred to as a glue layer) and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer and a TiN layer over the TaN layer. After the deposition of the work-function layer(s), a glue layer, which may be another TiN layer, is formed. The glue layer may or may not fully fill the trenches left by the removed dummy gate stacks.

The deposited gate dielectric layers and conductive layers are formed as conformal layers extending into the trenches, and include some portions over ILD 48. Next, if the glue layer does not fully fill the trenches, a metallic material is deposited to fill the remaining trenches. The metallic material may be formed of tungsten or cobalt, for example. Subsequently, a planarization process such as a CMP process or a mechanical grinding process is performed, so that the portions of the gate dielectric layers, stacked conductive layers, and the metallic material over ILD 48 are removed. As a result, gate electrodes 54 and gate dielectrics 52 are formed. Gate electrodes 54 and gate dielectrics 52 are collectively referred to as replacement gate stacks 56. The top surfaces of replacement gate stacks 56, gate spacers 38, CESL 46, and ILD 48 may be substantially coplanar at this time.

FIGS. 8A and 8B also illustrate the formation of (self-aligned) hard masks 58 in accordance with some embodiments. The respective process is illustrated as process 216 in the process flow 200 shown in FIG. 21. The formation of hard masks 58 may include performing an etching process to recess gate stacks 56, so that recesses are formed between gate spacers 38, filling the recesses with a dielectric material, and then performing a planarization process such as a CMP process or a mechanical grinding process to remove excess portions of the dielectric material. Hard masks 58 may be formed of silicon nitride, silicon oxy-nitride, silicon oxy-carbo-nitride, or the like.

Figure 9A:
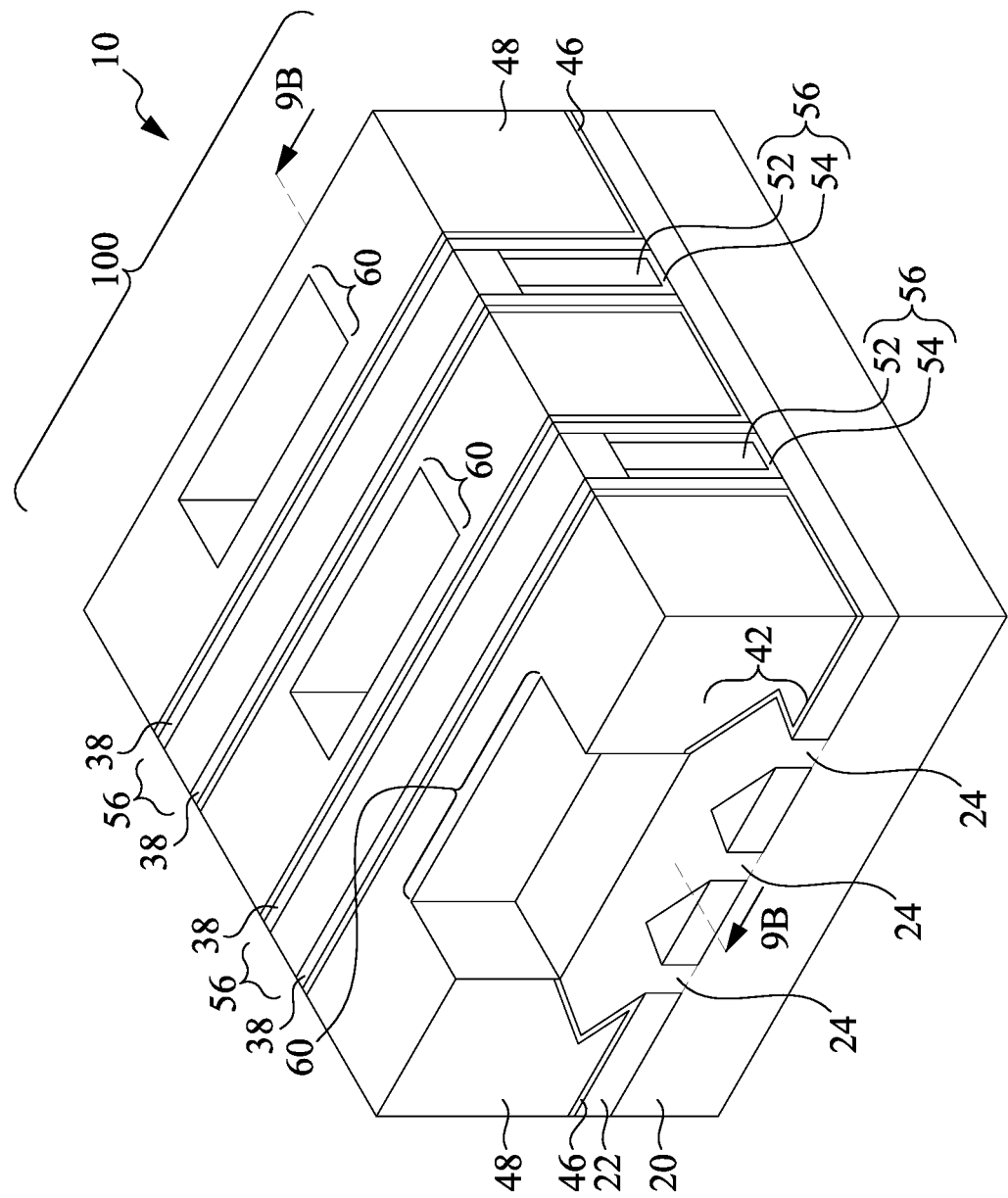
Figure 9B:
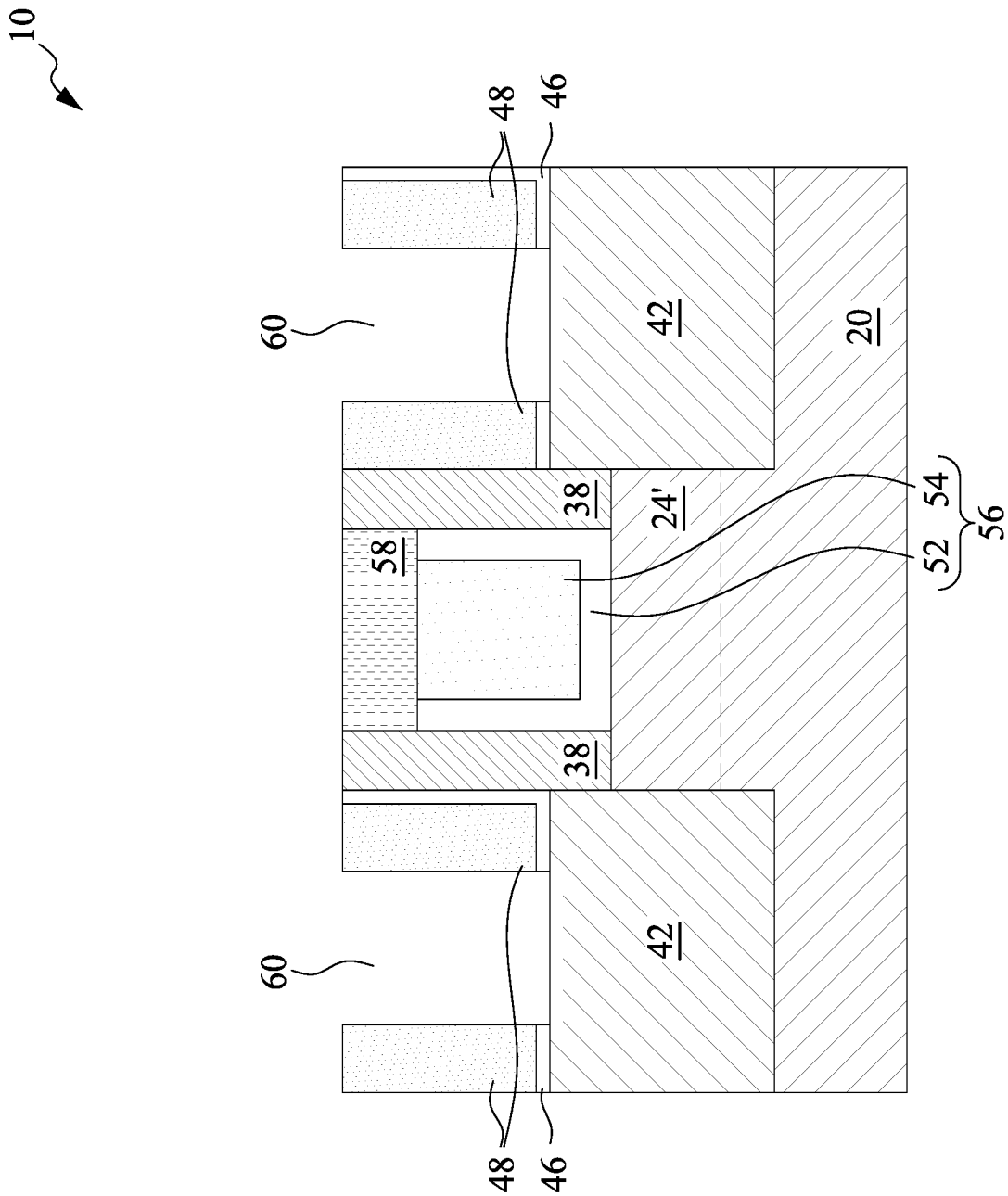

FIGS. 9A and 9B illustrate a perspective view and a cross-sectional view, respectively, in the formation of source/drain contact openings 60. The respective process is illustrated as process 218 in the process flow 200 shown in FIG. 21. FIG. 9B illustrates the reference cross-section 9B-9B in FIG. 9A. The formation of contact openings 60 includes etching ILD 48 to expose the underlying portions of CESL 46, and then etching the exposed portions of CESL 46 to reveal epitaxy regions 42. In accordance with some embodiments of the present disclosure, as illustrated in FIG. 9A, gate spacers 38 are spaced apart from the nearest contact openings 60 by some portions of ILD 48 and CESL 46.

Figure 10A:
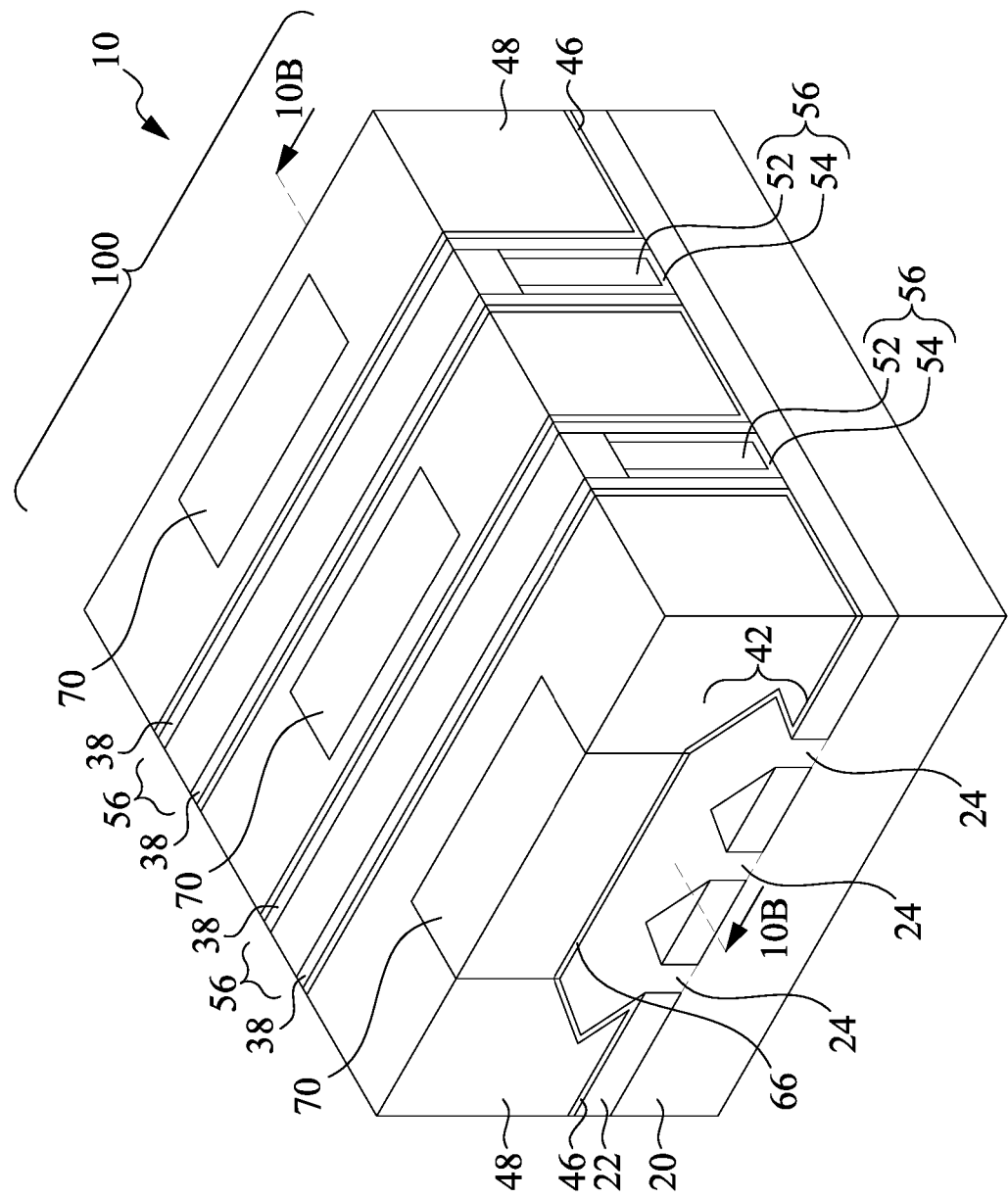
Figure 10B:
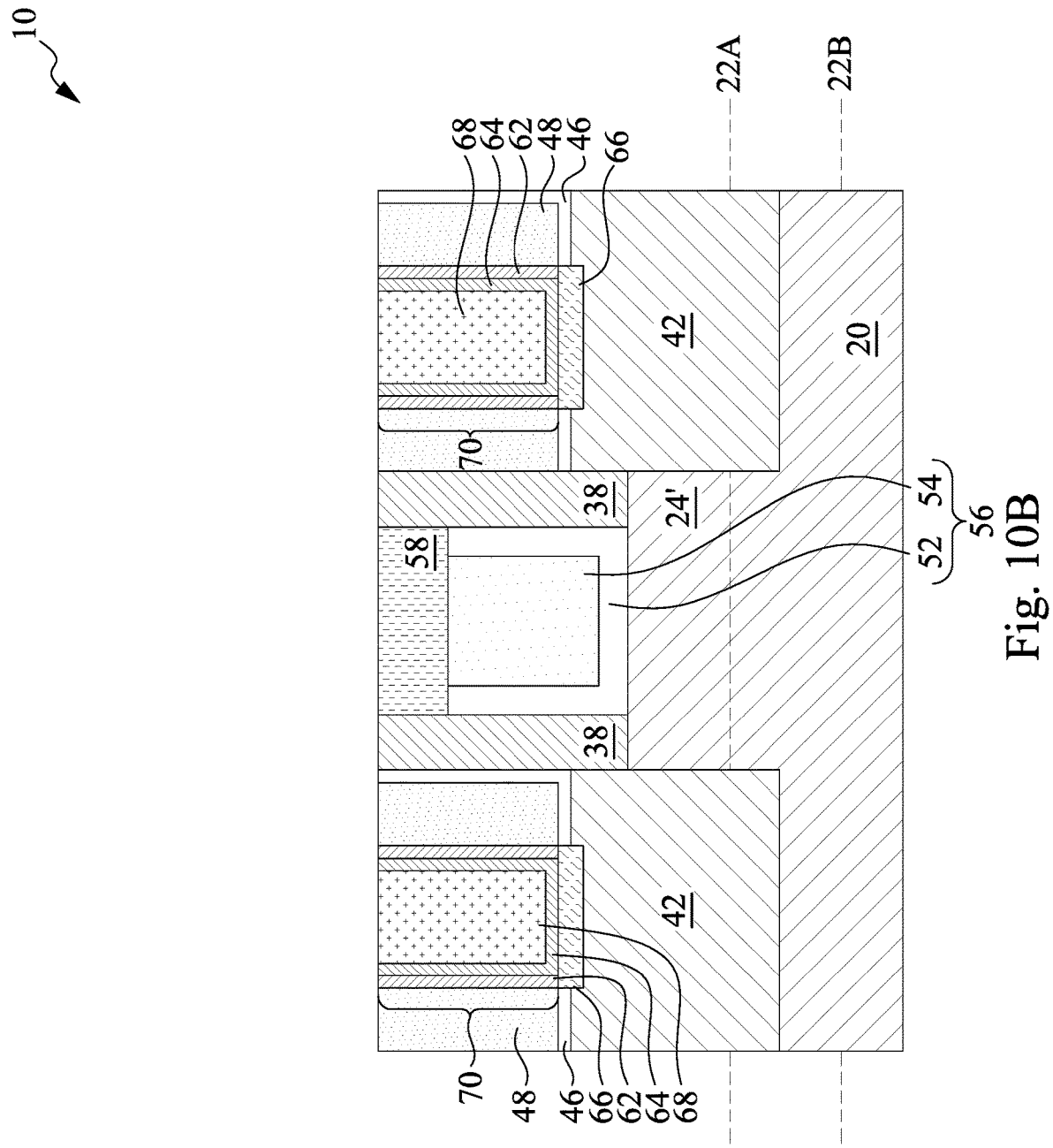

Referring to FIGS. 10A and 10B, silicide regions 66 and lower source/drain contact plugs 70 are formed. FIG. 10B illustrates the reference cross-section 10B-10B in FIG. 10A. In accordance with some embodiments, metal layer 62 (such as a titanium layer or a cobalt layer, FIG. 10B) is deposited, for example, using Physical Vapor Deposition (PVD) or a like method. Metal layer 62 is a conformal layer, and extends onto the top surface of source/drain regions 42 and the sidewalls of ILD 48. A metal nitride layer (such as a titanium nitride layer) 64 is deposited as a capping layer. An annealing process is then performed to form source/drain silicide regions 66, as shown in FIGS. 10A and 10B. The respective process is illustrated as process 220 in the process flow 200 shown in FIG. 21. Next, a metallic material 68, which may comprise cobalt, tungsten, or the like, is filled into the remaining portions of the contact openings. A planarization process such as a CMP process or a mechanical grinding process is then performed to remove excess portions of metal layer 62, metal nitride layer 64, and metallic material 68, leaving contact plugs 70. The respective process is also illustrated as process 220 in the process flow 200 shown in FIG. 21. FinFET 100 is thus formed.

Figure 11:
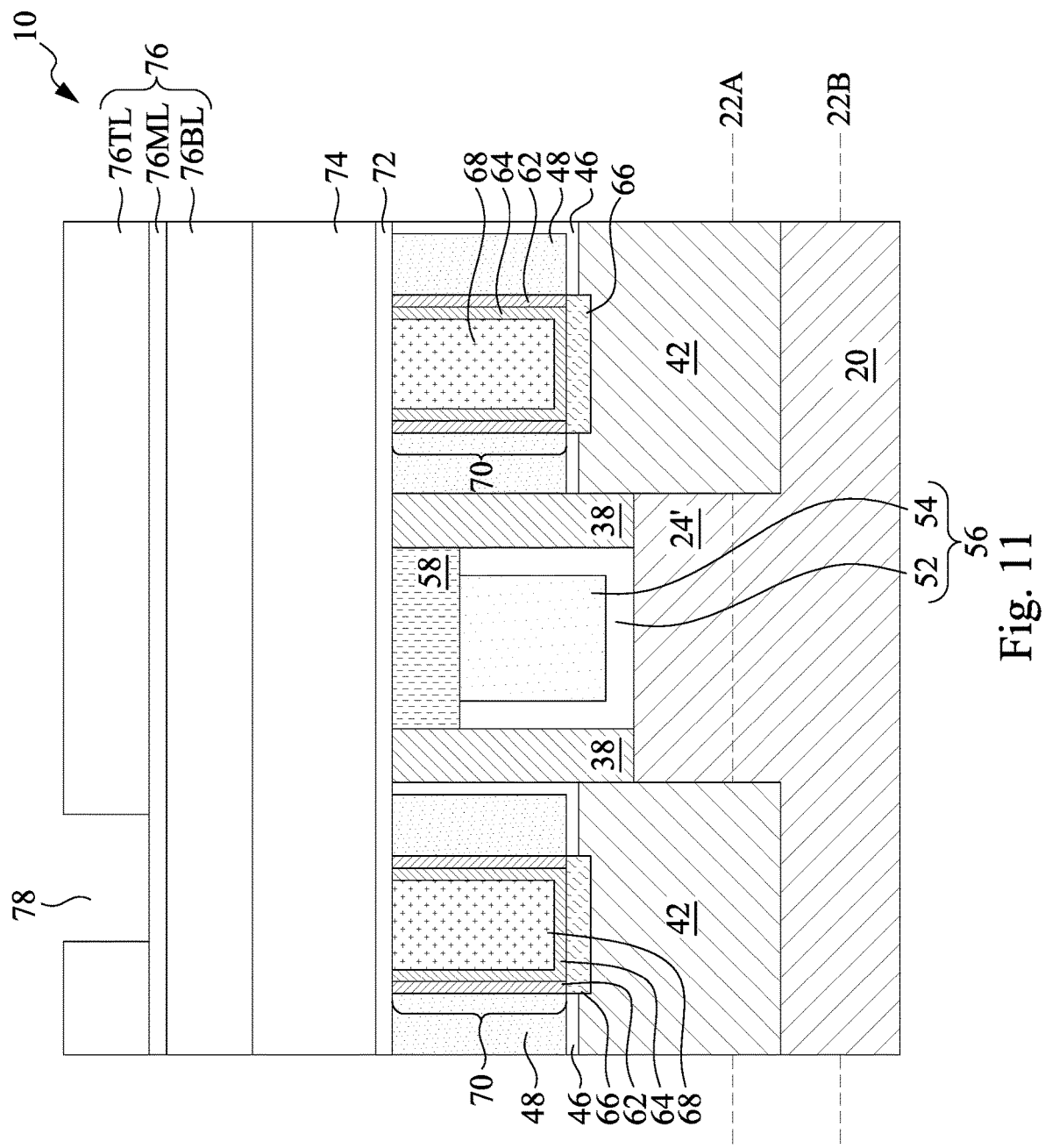

Referring to FIG. 11, etch stop layer 72 and ILD 74 are deposited. The respective process is illustrated as process 222 in the process flow 200 shown in FIG. 21. Etch stop layer 72 may be formed of a dielectric material such as SiN, SiCN, SiC, AlO, AlN, SiOCN, or the like, or composite layers thereof. The formation method may include PECVD, ALD, CVD, or the like.

ILD 74 is deposited over etch stop layer 72. The material and the formation method of ILD 74 may be selected from the same candidate materials and formation methods, respectively, for forming ILD 48. For example, ILD 74 may include silicon oxide, PSG, BSG, BPSG, or the like, which includes silicon therein. In accordance with some embodiments, ILD 74 is formed using PECVD, FCVD, spin-on coating, or the like. In accordance with alternative embodiments, ILD 74 may be formed of a low-k dielectric material.

An etching mask 76, which may be a tri-layer, is then formed. Etching mask 76 may include bottom layer (also sometimes referred to as an under layer) 76BL, middle layer 76ML over bottom layer 76BL, and top layer (also sometimes referred to as an upper layer) 76TL over middle layer 76ML. In accordance with some embodiments, bottom layer 76BL and top layer 76TL are formed of photo resists, with the bottom layer 76BL being cross-linked already. Middle layer 76ML may be formed of an inorganic material, which may be a nitride (such as silicon nitride), an oxynitride (such as silicon oxynitride), an oxide (such as silicon oxide), or the like. Middle layer 76ML has a high etching selectivity with relative to top layer 76TL and bottom layer 76BL, and hence top layer 76TL may be used as an etching mask for patterning middle layer 76ML, and middle layer 76ML may be used as an etching mask for patterning bottom layer 76BL. Top layer 76TL is patterned to form opening 78, which is used to define the pattern of a contact opening in ILD 74. A descum process may be performed, for example, using process gases $H_2$ and $N_2$. The pressure of the process gases may be in the range between about 40 mTorr and about 120 mTorr. The frequency of the source power may be about 60 MHz.

Figure 12:
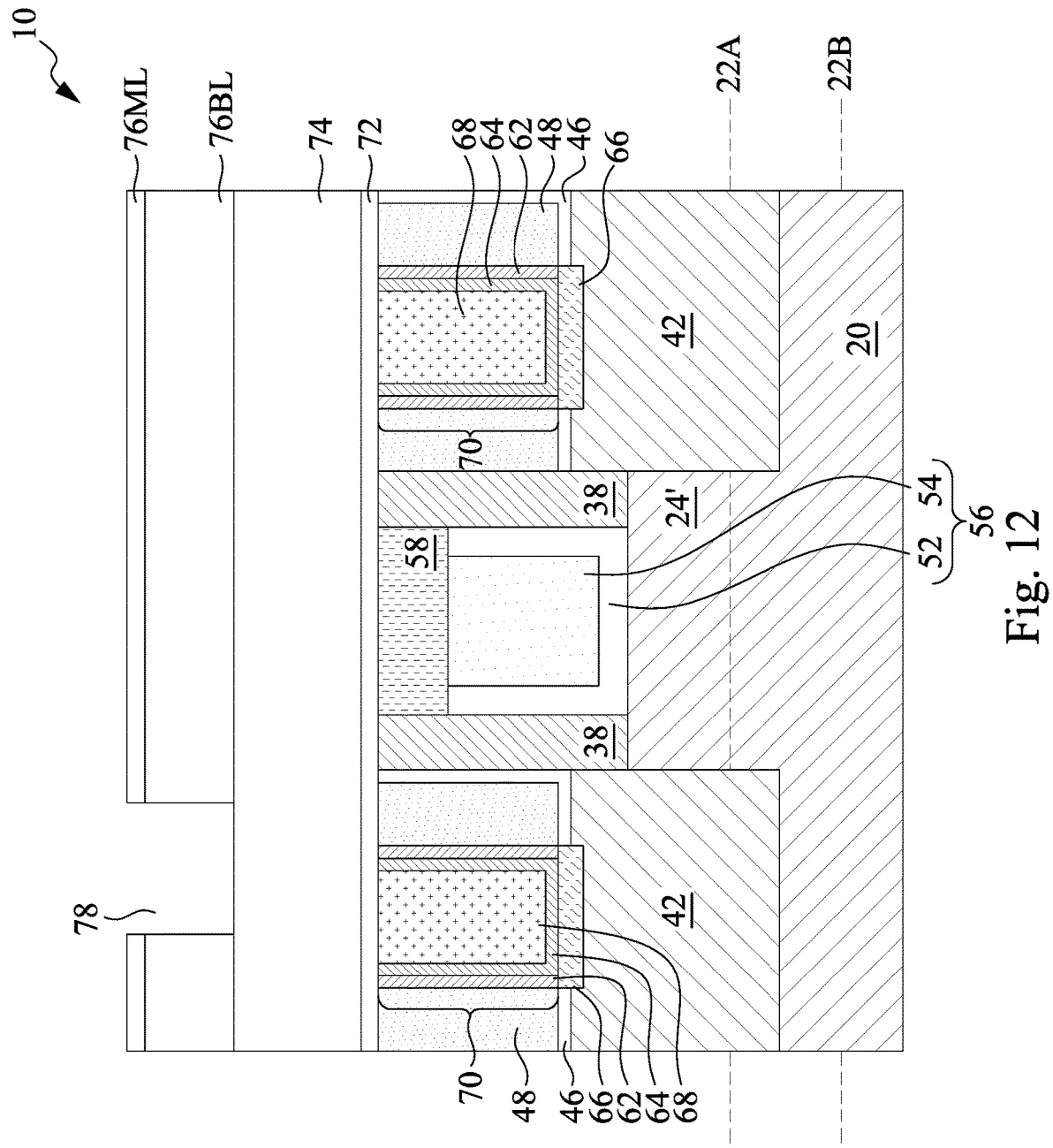

Next, middle layer 76ML is etched using the patterned top layer 76TL as an etching mask, so that the opening 78 extends into middle layer 76ML. The etching process may be performed, for example, using process gases including $CHF_3$, $N_2$, and $CF_4$. The pressure of the process gases may be in the range between about 20 mTorr and about 60 mTorr. The frequencies of the source power may include 60 MHz and 27 MHz. After middle layer 76ML is etched-through, bottom layer 76BL is further patterned, during which middle layer 76ML is used as an etching mask. During the patterning of bottom layer 76BL, top layer 76TL is consumed. Middle layer 76ML may be partially or fully consumed during the patterning of bottom layer 76BL. The etching process may be performed, for example, using process gases including $N_2$, $H_2$, Carbonyl sulfide (COS), and $O_2$. The pressure of the process gases may be in the range between about 5 mTorr and about 25 mTorr. The frequencies of the source power may include 60 MHz and 27 MHz. In the patterning of bottom layer 76BL, opening 78 extends downwardly, revealing ILD 74. The resulting structure is shown in FIG. 12.

Figure 13:
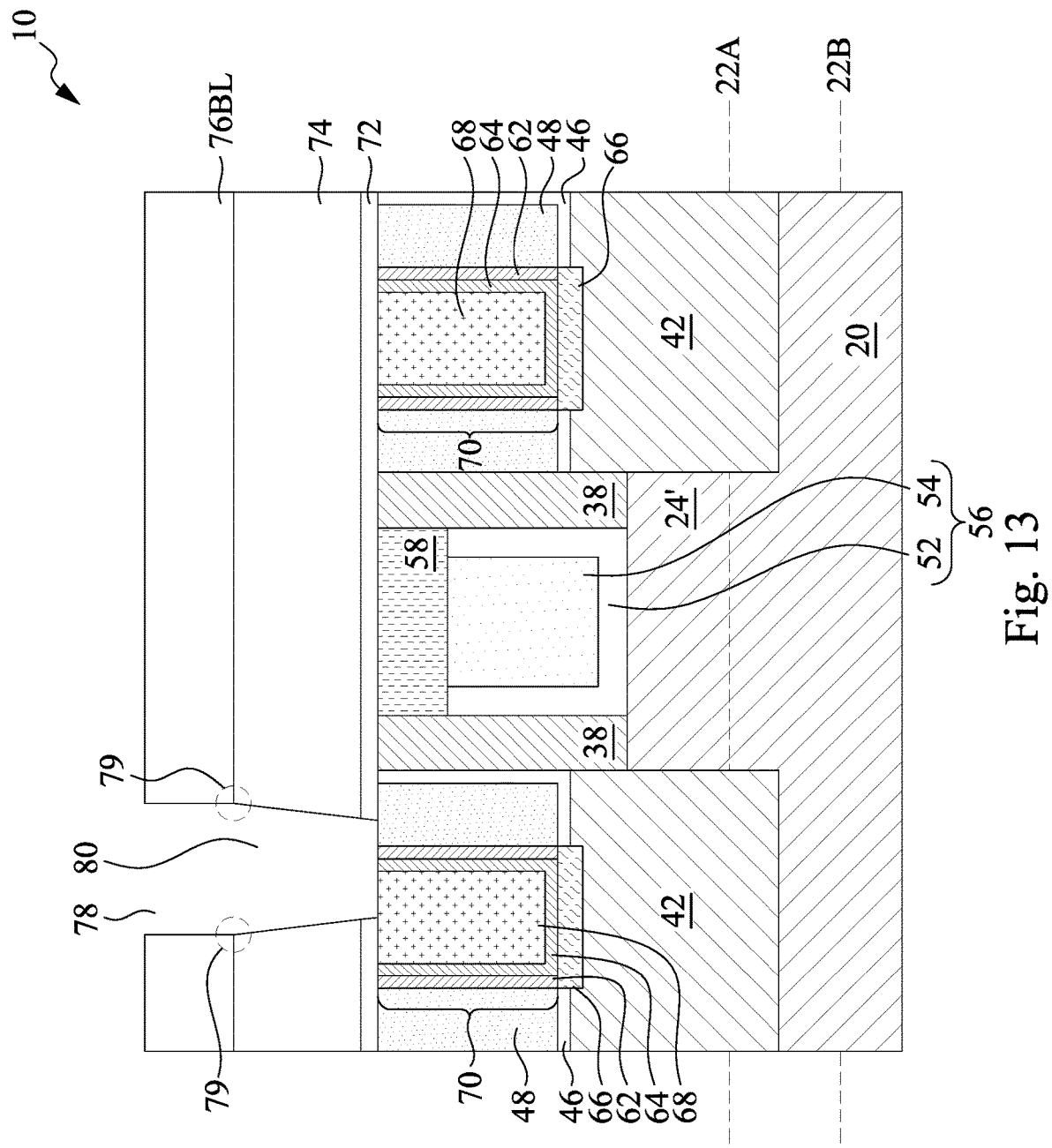

FIG. 13 illustrates the etching of ILD 74 to form source/drain contact opening 80. The respective process is illustrated as process 224 in the process flow 200 shown in FIG. 21. In accordance with some embodiments, the etching process includes a main etching process followed by an over-etching process. The main etching process may be performed, for example, using process gases including $CF_4$. The pressure of the process gases may be in the range between about 5 mTorr and about 45 mTorr. The frequencies of the source power may include 2 MHz and 27 MHz. The main etching may extend the opening 80 into an upper portion of ILD 74 to a depth in the range between about 10 nm and about 20 nm, for example. The main etching process has a higher etching selectivity ER74/ER76BL, wherein ER74 is the etching rate of ILD 74, and ER76BL is the consuming rate of bottom layer 76BL.

The over-etching process may be performed, for example, using process gases including $C_4F_6$, $O_2$, and Ar. The pressure of the process gases may be in the range between about 5 mTorr and about 45 mTorr. The frequencies of the source power may include 2 MHz, 27 MHz, and 60 MHz. The over-etching process may extend the opening 80 into a lower portion of ILD 74, with the etched depth in the range between about 10 nm and about 30 nm, for example. The over-etching process has a lower etching selectivity ER74/ER76BL than in the main etching. During the over-etching process, a photo-resist pull-back process may be performed, for example, using $O_2$ as process gas, with the $O_2$ having a pressure in the range between about 20 mTorr and about 60 mTorr. The pull-back process is isotropic, so that the opening 80 is enlarged. This may cause the top corner portions of ILD 74 in regions 79 to be removed, and the corners are rounded, for an easier filling of conductive materials in subsequent processes.

After etch stop layer 72 is exposed, a wet cleaning process may be performed. A treatment may also be performed using process gases such as $N_2$ and $H_2$. The pressure of the process gases may be in the range between about 40 mTorr and about 80 mTorr. The frequencies of the source power may include 60 MHz. Next, a purging process using $N_2$ (also referred to as an $N_2$ charge process) may be performed to remove the moisture in the etching chamber.

Further referring to FIG. 13, etch stop layer 72 is etched. The respective process is also illustrated as process 224 in the process flow 200 shown in FIG. 21. The etching may also be performed using process gases such as $CHF_3$ as a process gas, while carrier gases such as $N_2$ and/or Ar may be added. The pressure of the process gases may be in the range between about 70 mTorr and about 170 mTorr. The frequencies of the source power may include 2 MHz and 60 MHz. The preceding purging process using $N_2$ removes the moisture from the corresponding process chamber, and hence contact plug 70, which may be damaged by fluorine and water containing process gases, is not damaged in this etching process.

Figure 14:
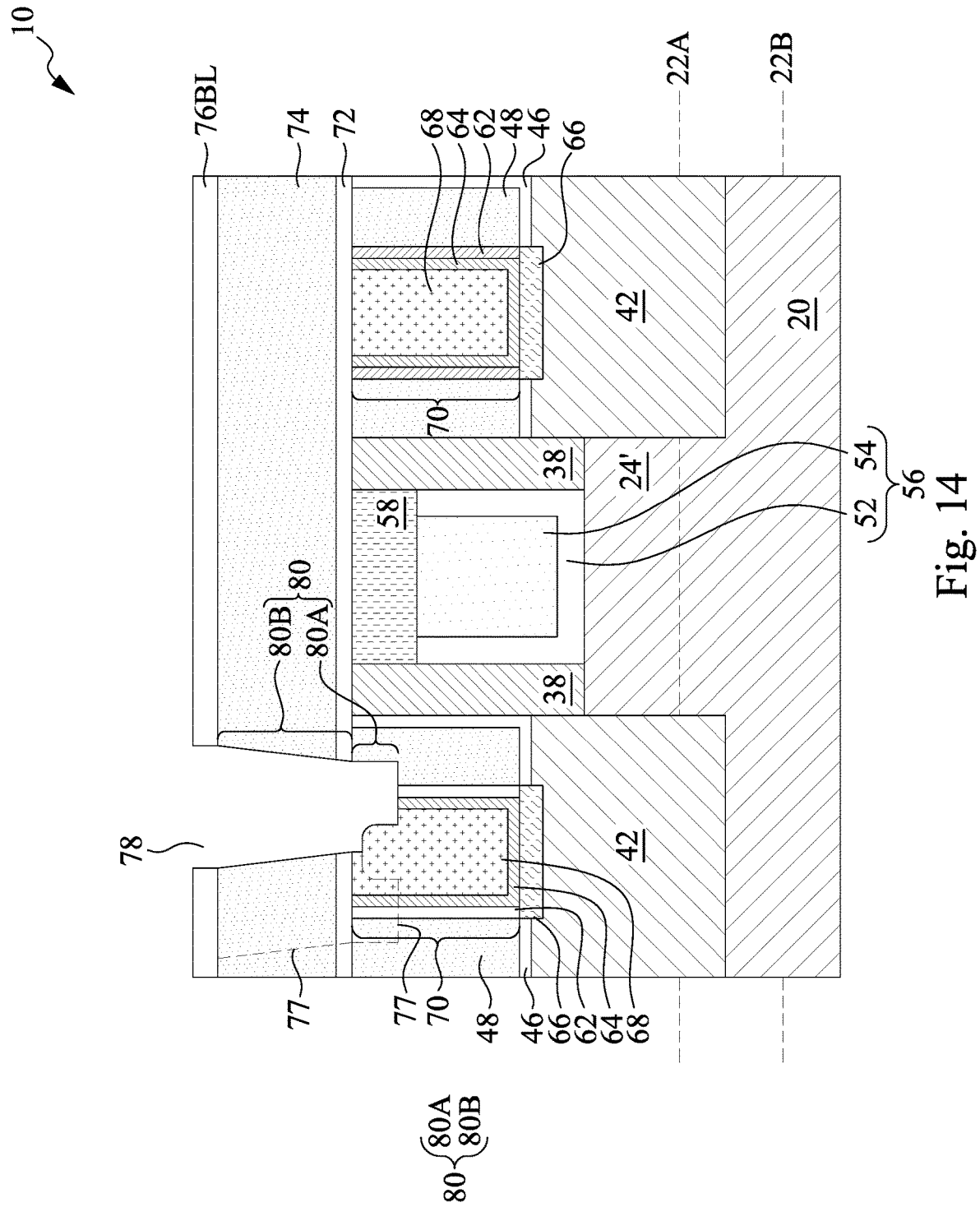

FIG. 14 illustrates the etching process for etching ILD 48, metal layer 62, and metal nitride layer 64. The respective process is illustrated as process 226 in the process flow 200 shown in FIG. 21. As shown in FIG. 13, opening 80 has a first portion directly over contact plug 70, and a second portion vertically offset from contact plug 70. The etching may also be performed using process gases such as $CHF_3$ and $H_2O$, while carrier gases such as $N_2$ and/or Ar may be added. The pressure of the process gases may be in the range between about 20 mTorr and about 120 mTorr. The frequencies of the source power may include 60 MHz. In the etching process, with the etching of ILD 48, opening 80 extends into ILD 48, and hence the sidewall of lower contact plug 70 is exposed. The metals in contact plug 70 react with the fluorine-containing process gases to form metal fluorides, and the metal fluorides may be removed by $H_2O$. Furthermore, metal nitride layer 64 may also be etched by the process gases. Accordingly, as shown in FIG. 14, the sidewall of metal region 68, which may be formed of cobalt or other metal, is exposed to opening 80. With the preceding of the etching process, metal region 68 is also etched vertically and laterally, with the top surface of metal region 68 being lowered, the sidewall of metal region 68 being laterally recessed, and the corner of metal region 68 being rounded. The resulting structure is shown in FIG. 14. The resulting opening 80 includes lower portion 80A in ILD 48, and upper portion 80B in etch stop layer 72 and ILD 74. After the process as shown in FIG. 14, bottom layer 76BL is removed, for example, through an ashing process using $O_2$.

In accordance with alternative embodiments, instead of having opening 80 offset to one side of lower contact plug 70, opening 80 is wider than lower contact plug 70, and hence opening 80 extends into ILD 48 on opposite sides of contact plug 70, and contact the opposite sidewalls of metal regions 68. The sidewall and the bottoms of the corresponding opening 80 are shown in FIG. 14 using dashed lines 77.

Figure 15:
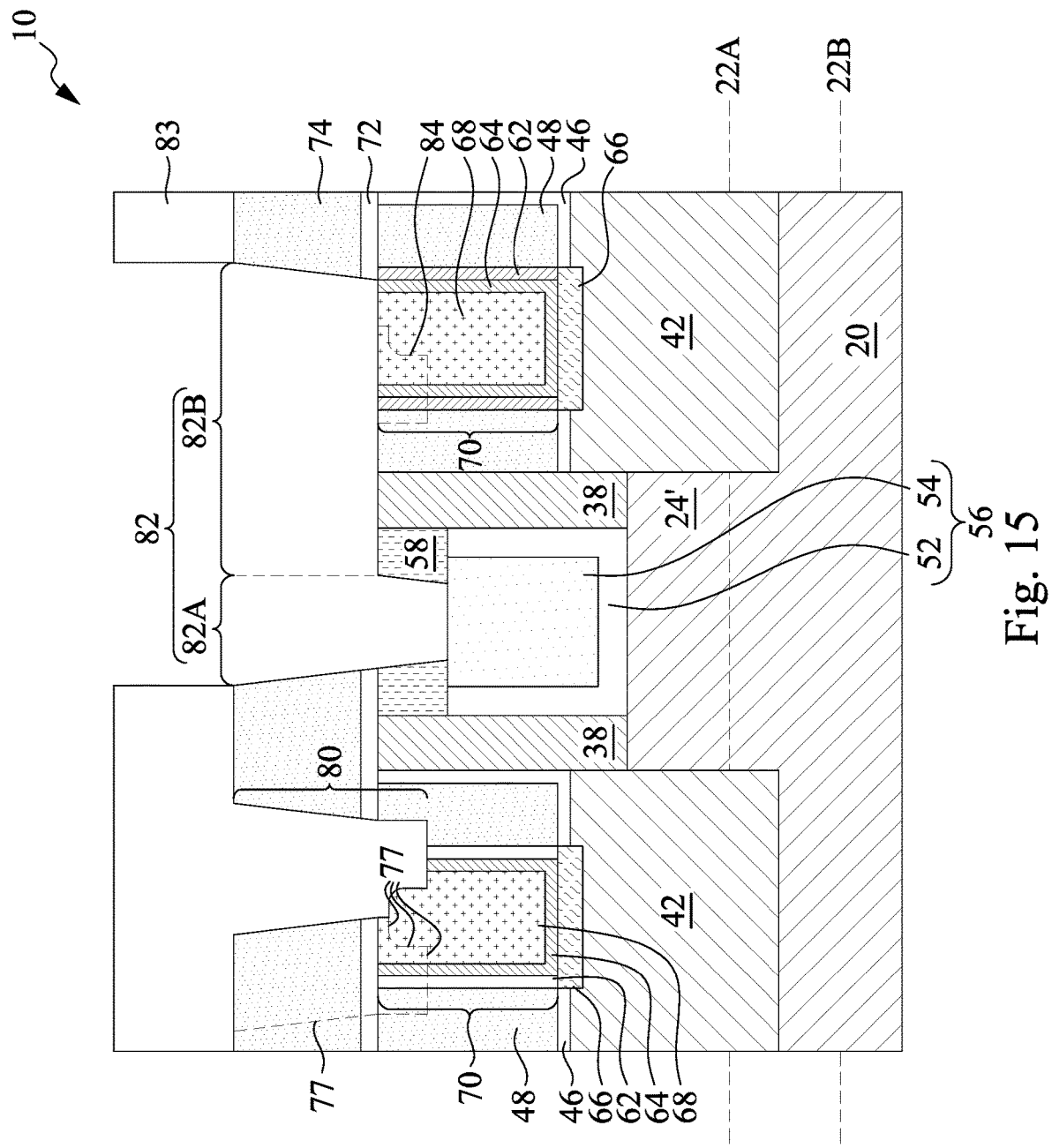

Referring to FIG. 15, ILD 74 and etch stop layer 72 are further etched to form opening 82. The respective process is illustrated as process 228 in the process flow 200 shown in FIG. 21. Etching mask 83, which may include a photo resist (or may be a tri-layer), may be formed and patterned. The etching gases sued for etching ILD 74 and etch stop layer 72 are selected according to the materials of ILD 74, etch stop layer 72, ILD 48, and CESL 46. In accordance with some embodiments, opening 82 includes portion 82A and portion 82B, with portion 82A extending to the respective underlying gate electrode 54, and portion 82B extend to the respective underlying lower source/drain contact plug 70.

Figure 16:
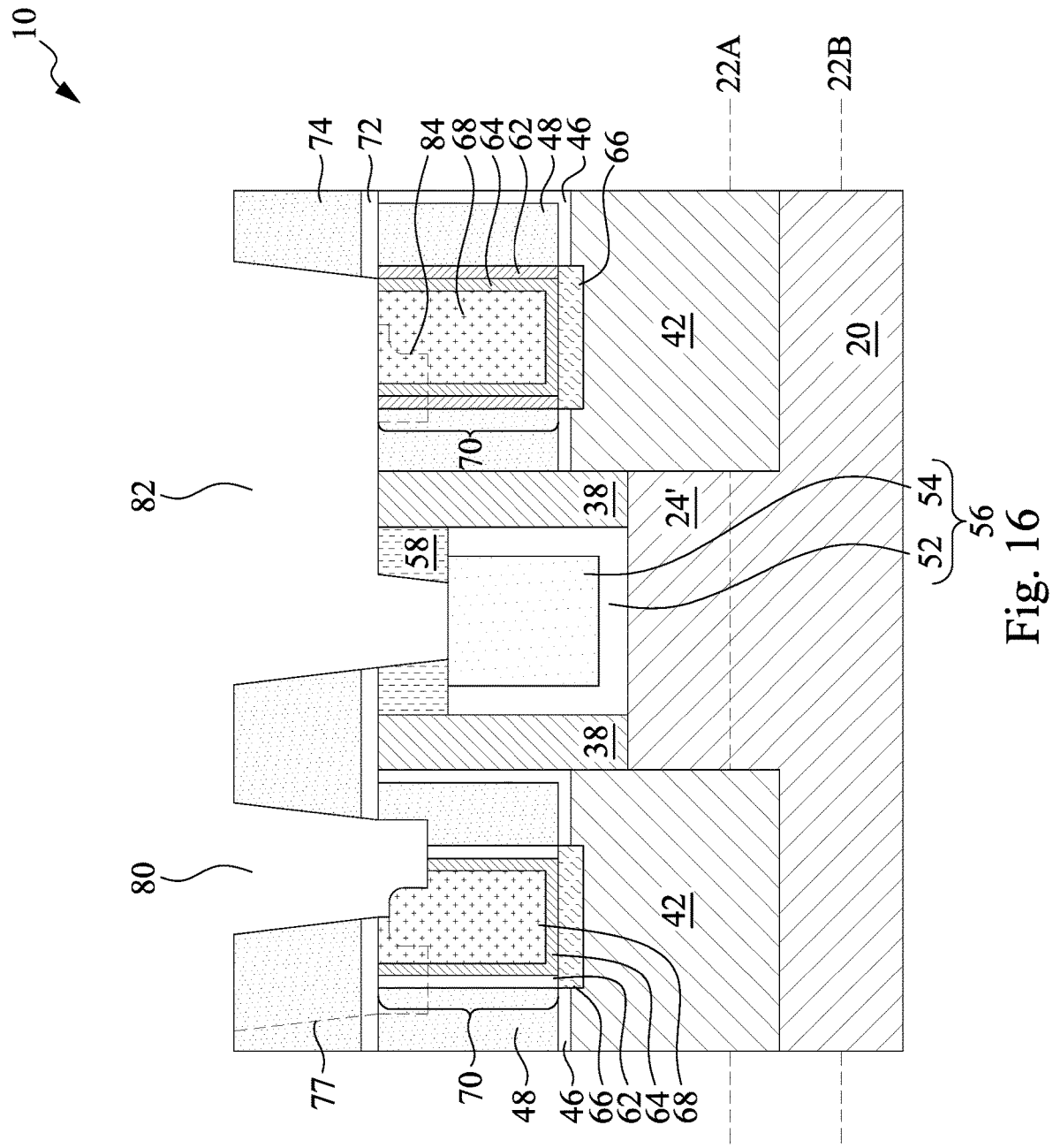

In accordance with some embodiments, the formation of opening 82 includes a plurality of etching processes including, for example, a first etching process to form portion 82A, and a second etching process to form portion 82B. Furthermore, portion 82B may stop on the top surface of ILD 48, or may extend into ILD 48, depending on the selected etching gases. Accordingly, ILD 48, metal layer 62, and metal nitride layer 64 may also be etched. The corresponding sidewalls and bottom of the respective part of opening 82 are indicated by dashed line 84. The formation of this part of opening 82 may be performed using an additional etching mask similar to the formation of opening portion 82A. Etching mask 83 is then removed. The resulting structure is shown in FIG. 16.

Figure 17:
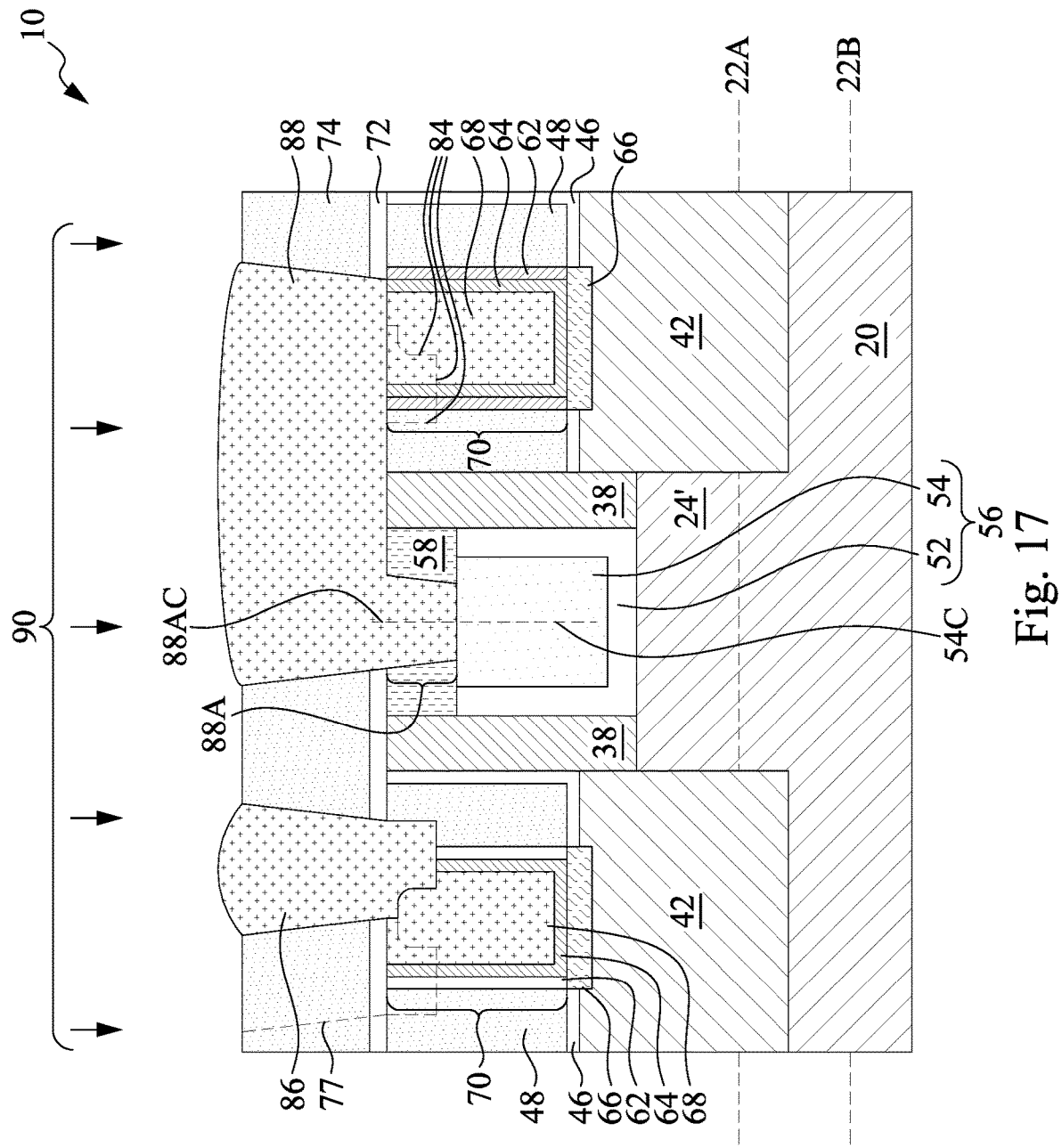

In a subsequent process, a pre-treatment may be performed, for example, using $H_2$ as a process gas, which form Si—H bonds at the surface of ILD 74 in openings 80 and 82, and form metal-H bonds (such as Co—H bonds) at the surface of metallic material 68. In accordance with some embodiments, the pressure of $H_2$ is in the range between about 5 Torr and about 40 Torr. Openings 80 and 82 are then filled with a conductive material(s) to form upper source/drain contact plug 86 and contact plug 88, as shown in FIG. 17. The respective process is illustrated as process 230 in the process flow 200 shown in FIG. 21. The formation process includes depositing desirable conductive materials/layers. In accordance with some embodiments, contact plugs 86 and 88 are formed of a homogenous conductive material, and the entire conductive material has the same composition, and may be formed of titanium nitride, tungsten, cobalt, or the like. In an example embodiment in which tungsten if filled, the process gas may include $WF_6$ and $H_2$, which react to form elemental tungsten and HF gas. The reaction temperature may in the range between about 250° C. and about 450° C. The pressure of the process gas may be in the range between about 5 Torr and about 20 Torr. In accordance with alternative embodiments, each of contact plugs 86 and 88 has a composite structure including, for example, a barrier layer and a metallic material over the barrier layer. The barrier layer may be formed of titanium nitride, titanium, tantalum nitride, tantalum, or the like, and the metallic material may be formed of tungsten, cobalt, copper, or the like. Contact plug 88 electrically and physically interconnects gate electrode 54 and the corresponding lower source/drain contact plug 70.

Furthermore, since contact plug 86 is intentionally (not due to overlay offset) offset from the respective lower source/drain contact plug 70, the middle line 88AC of gate contact plug 88A, which is the portion of contact plug 88 in hard mask 58, may be vertically aligned to the middle line 54C of gate electrode 54 and gate stack 56. FIG. 17 also shows that contact plug 86 may extend to wherein dashed lines 77 is located, and contact plug 88 may extend to wherein dashed lines 84 is located.

An implantation process 90 is then performed. The respective process is illustrated as process 232 in the process flow 200 shown in FIG. 21. During implantation process 90, a dopant is implanted to cause ILD 74 to be densified, and ILD 74 may try to expand, so that contact plugs 86 and 88 are squeezed, and their lateral dimensions are reduced. In accordance with some embodiments, the dopant comprises Ge, Xe, Ar, Si, or combinations thereof. In the implantation process, the implanted dopant may be mainly implanted into an upper portion (such as the upper half) of ILD 74, and not into the lower portion (such as the lower half) of ILD 74. Contact plugs 86 and 88 are dense enough, and the dopant is substantially outside of contact plugs 86 and 88, and the implantation dopant is limited in the shallow top surface portions of contact plugs 86 and 88. Furthermore, the implantation depth in contact plugs 86 and 88 is significantly smaller than in ILD 48, for example, with a ratio of the implantation depths being smaller than about 1:5.

Figure 18:
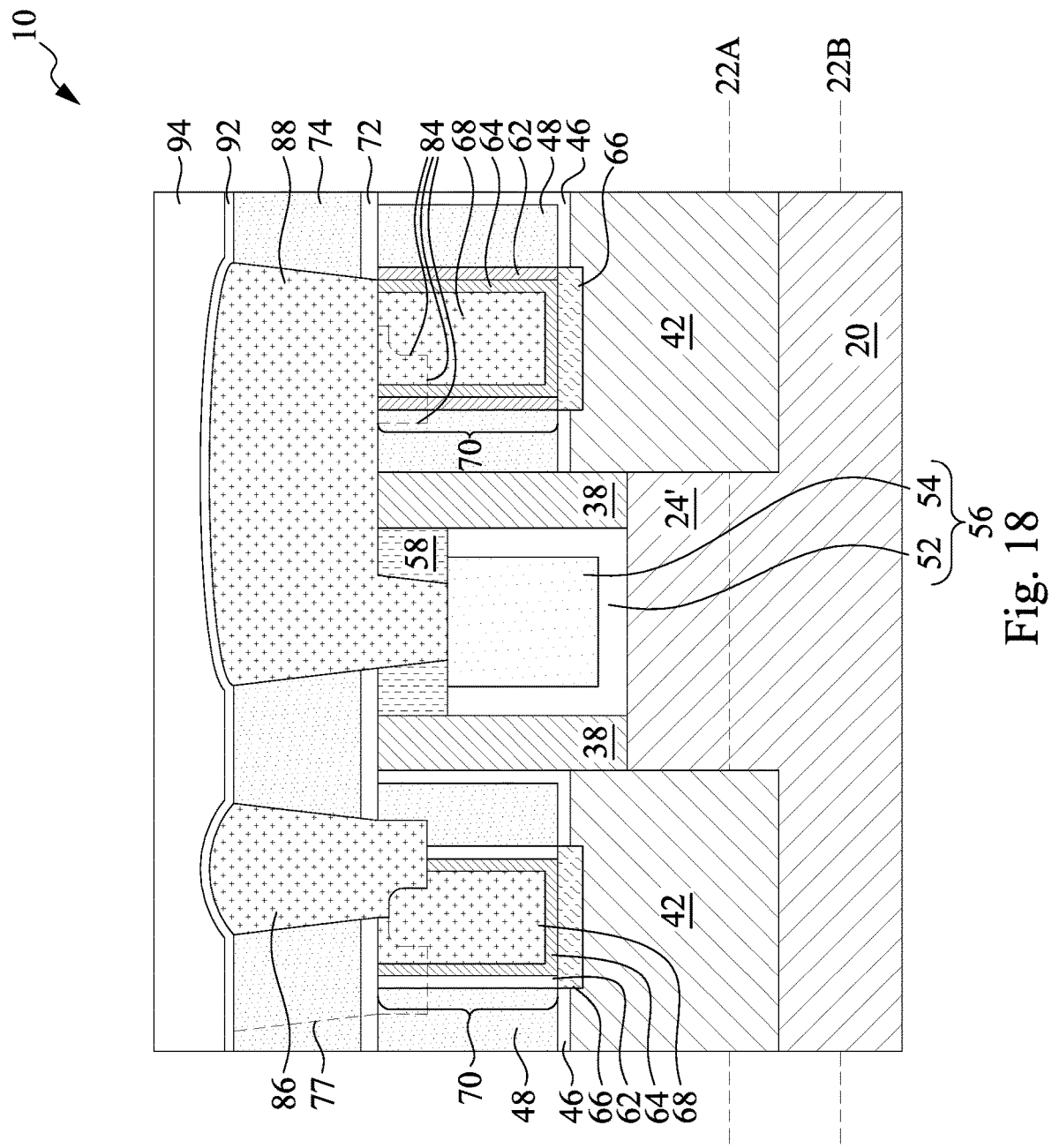

FIG. 18 illustrates the deposition of sacrificial adhesion layer 92 and sacrificial metal layer 94. The respective process is illustrated as process 234 in the process flow 200 shown in FIG. 21. In accordance with some embodiments, adhesion layer 92 comprises Ti, TiN, Ta, TaN, or the like, and may be deposited as a conformal layer. Metal layer 94 may comprise tungsten, cobalt, or the like. A planarization process is then performed to remove metal layer 94 and adhesion layer 92 and to planarize the top surfaces of contact plugs 86 and 88. The respective process is illustrated as process 236 in the process flow 200 as shown in FIG. 21. Although metal layer 94 and adhesion layer 92 are removed, the formation of these layers helps to reduce the stress suffered by contact plugs 86 and 88 during the planarization process, and the delamination between contact plugs 86/88 and ILD 74 is reduced.

Figure 19:
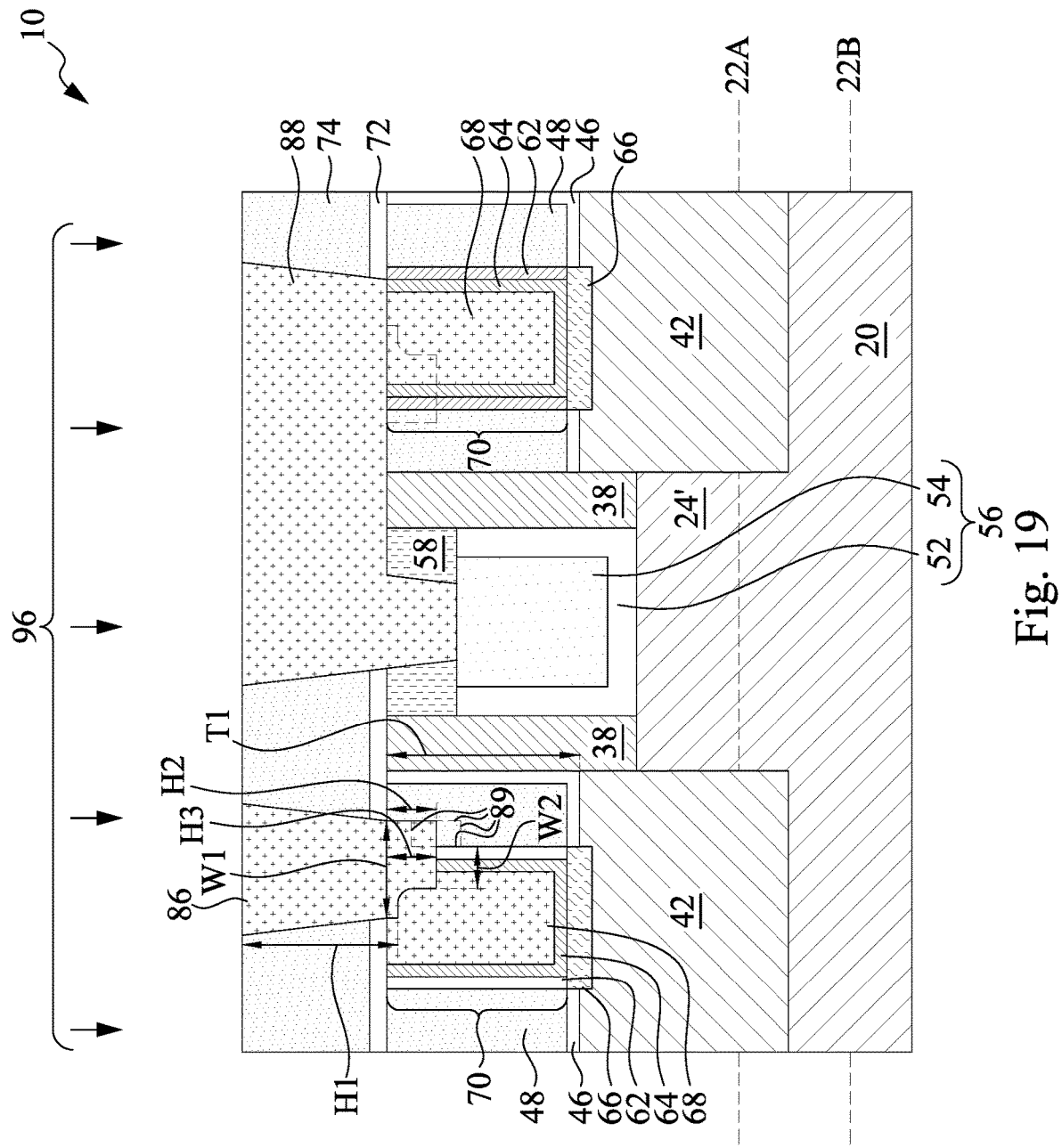

Referring to FIG. 19, a second implantation process 96 may be performed. The respective process is illustrated as process 238 in the process flow 200 shown in FIG. 219. In implantation process 96, a dopant such as Ge, Xe, Ar, Si, or combinations thereof may be implanted. In the second implantation process, the implanted dopant may be mainly implanted into an upper portion (such as the upper half) of ILD 74, similar to the first implantation process.

Some example dimensions are marked in FIG. 19. It is appreciated that these dimensions are examples, and may be changed to different values. Height H1, which is from the top surface of upper source/drain contact plug 86 to the top surface of lower source/drain contact plug 70, may be in the range between about 200 nm and about 500 nm. Width W1, which is the width of upper source/drain contact plug 86 measured at the bottom surface of etch stop layer 72, may be in the range between about 10 nm and about 20 nm. Height H2, which is the recessing depth of ILD 48, may be in the range between about 0.5 nm and about 10 nm. Height H3, which is the recessing depth of metal layer 62, may be in the range between about 0.5 nm and about 10 nm. It is appreciated that although height H2 is illustrated as being equal to height H3, height H2 may also be greater than or smaller than height H3. Accordingly, the bottom surfaces of the corresponding contact plug 86 may also be at the levels marked at the dashed lines 89. Furthermore, the ratio of H2 to thickness T1 of ILD 48 may in the range between about 0.1 and about 0.5 (or between about 0.25 and about 0.5) in accordance with some embodiments. Width W1, which is the width of upper source/drain contact plug 86 measured at the top surface of etch stop layer 72, may be in the range between about 10 nm and about 20 nm. Width W2, which is the width of the portion of upper source/drain contact plug 86 below etch stop layer 72, may be in the range between about 3 nm and about 10 nm.

Figure 20:
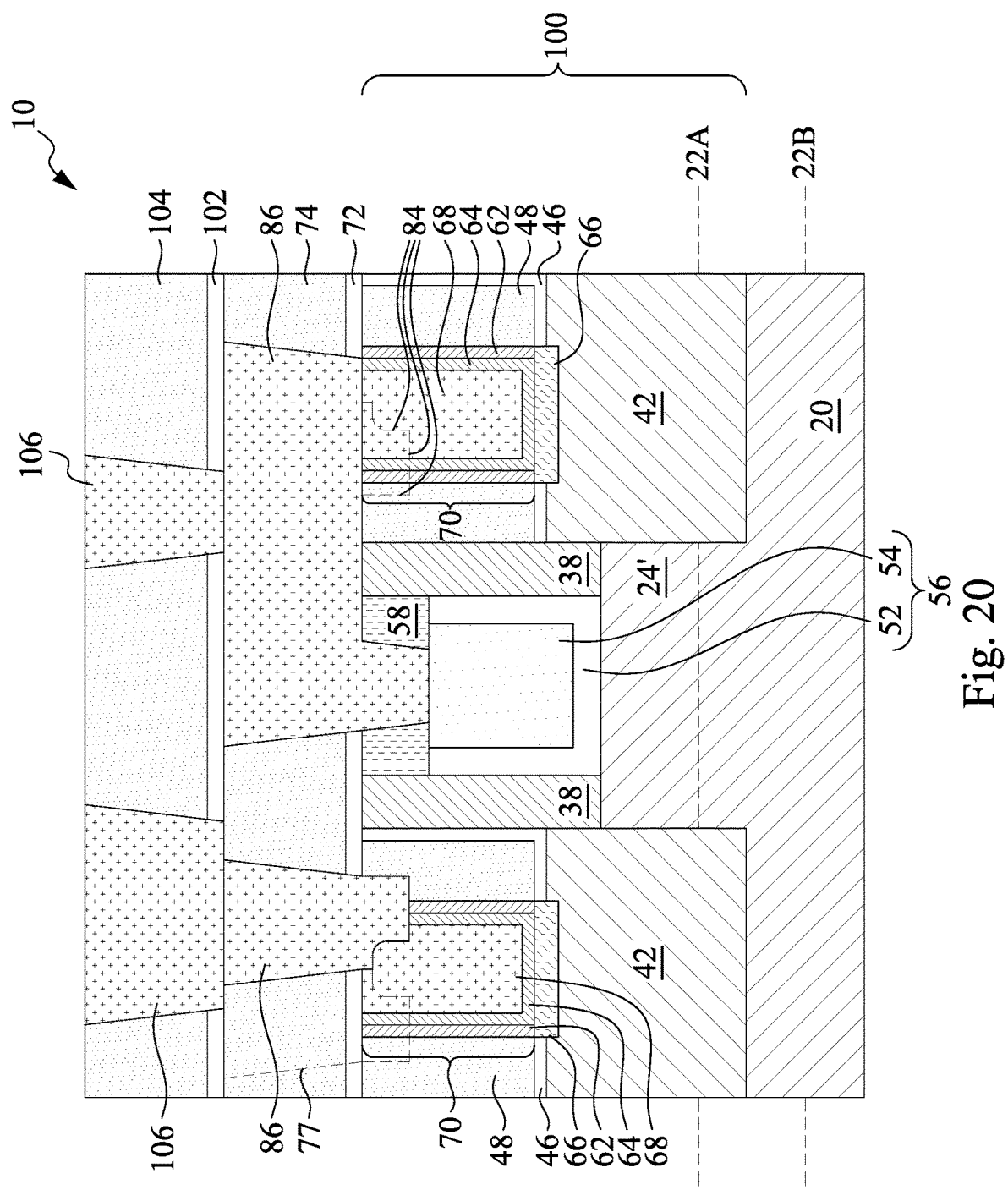
Figure 21:
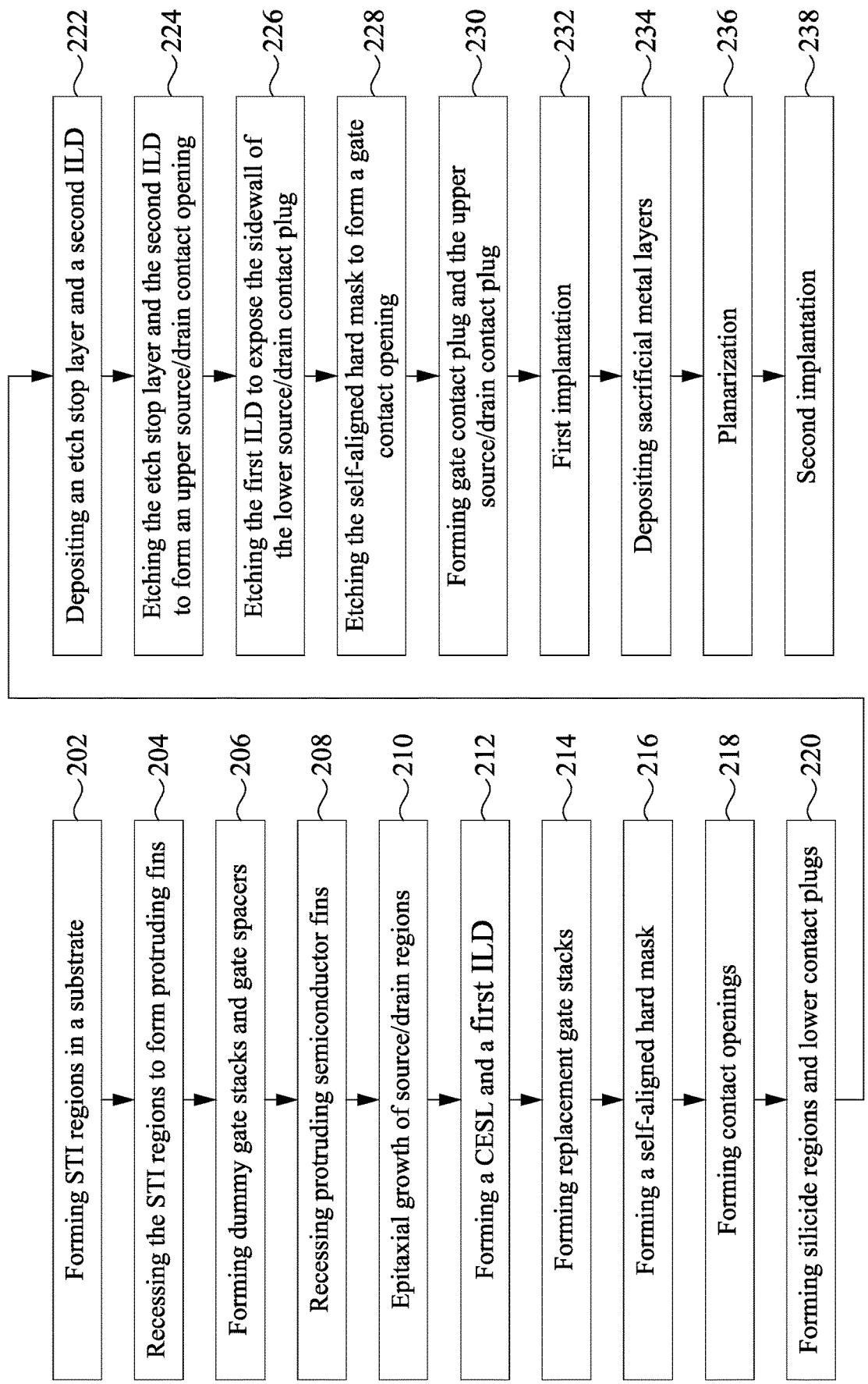
FIG. 21 illustrates a process flow for forming a transistor and contact plugs in accordance with some embodiments.

FIG. 20 illustrates the formation of etch stop layer 102, dielectric layer 104 (also referred to as an Inter-Metal Dielectric (IMD)), and metal lines/vias 106. Etch stop layer 102 may be formed of SiON, aluminum oxide, aluminum nitride, or the like, or composite layers thereof. In accordance with some embodiments of the present disclosure, Dielectric layer 104 may be formed of a low-k dielectric material having a dielectric constant (k-value) lower than about 3.0. For example, dielectric layer 104 may be formed of or comprise Black Diamond (a registered trademark of Applied Materials), a carbon-containing low-k dielectric material, Hydrogen SilsesQuioxane (HSQ), MethylSilses-Quioxane (MSQ), or the like. In accordance with some embodiments of the present disclosure, the formation of dielectric layer 104 includes depositing a porogen-containing dielectric material, and then performing a curing process to drive out the porogen, and hence the remaining dielectric layer 104 is porous.

Metal lines/vias 106 are formed in dielectric layer 104. The formation process may include a damascene process, for example, a single damascene process as shown in FIG. 17. The formation process may include etching dielectric layer 104 and etch stop layer 102 to form trenches, filling conductive materials into the trenches, and performing a CMP process to remove excess conductive materials. Each of metal lines/vias 106 may include a diffusion barrier, and a metallic material over the diffusion barrier. The diffusion barrier may be formed of or comprise titanium nitride, tantalum nitride, titanium, tantalum, or the like. The metallic material may include copper or a copper alloy.

The embodiments of the present disclosure have some advantageous features. By forming an upper source/drain contact plug extending into an underlying ILD, and contacting both of the sidewall and the top surface of a lower source/drain contact plug, the adhesion to the lower source/drain contact plug is improved without causing the upper source/drain contact plug to break.

In accordance with some embodiments of the present disclosure, a method comprises forming a source/drain region for a transistor; forming a first inter-layer dielectric over the source/drain region; forming a lower source/drain contact plug over and electrically coupling to the source/drain region, wherein the lower source/drain contact plug extends into the first inter-layer dielectric; depositing an etch stop layer over the first inter-layer dielectric and the lower source/drain contact plug; depositing a second inter-layer dielectric over the etch stop layer; performing an etching process to etch the second inter-layer dielectric, the etch stop layer, and an upper portion of the first inter-layer dielectric to form an opening, with a top surface and a sidewall of the lower source/drain contact plug being exposed to the opening; and forming an upper contact plug in the opening. In an embodiment, the lower source/drain contact plug comprises a diffusion barrier; and a metallic material on the diffusion barrier, wherein during the etching process, a portion of the diffusion barrier is etched to expose a vertical sidewall of the metallic material. In an embodiment, the etch stop layer and the upper portion of the first inter-layer dielectric are etched using process gases comprising a fluorine-and-carbon-containing gas. In an embodiment, the diffusion barrier is also etched using the process gases comprising the fluorine-and-carbon-containing gas and $H_2O$. In an embodiment, the method further includes after the upper contact plug is formed, performing an implantation process to implant the second inter-layer dielectric. In an embodiment, the implantation process is performed using a dopant comprising Ge, Xe, Ar, Si, or combinations thereof. In an embodiment, the first inter-layer dielectric has a thickness, and the opening extends into the first inter-layer dielectric for a depth, and wherein a ratio of the depth to the thickness is in a range between about 0.1 and about 0.5. In an embodiment, the second inter-layer dielectric and the upper portion of the first inter-layer dielectric are etched using a same etching mask. In an embodiment, the method further comprises forming a gate stack, wherein the gate stack and the source/drain region are neighboring each other; and forming a gate contact plug, wherein the gate contact plug is aligned to a vertical middle line of the gate stack with the upper contact plug contacting the sidewall of the lower source/drain contact plug.

In accordance with some embodiments of the present disclosure, an integrated circuit structure comprises a gate stack over a semiconductor region; a source/drain region on a side of the gate stack; a source/drain silicide region over the source/drain region; a first inter-layer dielectric over the source/drain silicide region; a lower source/drain contact plug over and contacting the source/drain silicide region; an etch stop layer over the first inter-layer dielectric and the lower source/drain contact plug; a second inter-layer dielectric over the etch stop layer; and an upper contact plug penetrating through the second inter-layer dielectric and the etch stop layer, and extending into an upper portion of the first inter-layer dielectric, wherein a first sidewall of the upper contact plug contacts a second sidewall of the lower source/drain contact plug. In an embodiment, the lower source/drain contact plug comprises a diffusion barrier; and a metallic material on the diffusion barrier, wherein the first sidewall of the upper source/drain contact plug contacts the second sidewall of the metallic material. In an embodiment, the diffusion barrier comprises titanium nitride, and the metallic material comprises a material selected from tungsten, cobalt, and combinations thereof. In an embodiment, the integrated circuit structure further comprises a gate contact plug over and contacting the gate stack, wherein middle lines of the gate contact plug and the gate stack are vertically aligned. In an embodiment, a third sidewall of the upper contact plug contacts a fourth sidewall of the lower source/drain contact plug, and wherein the second sidewall and the fourth sidewall are opposing sidewalls of the lower source/drain contact plug. In an embodiment, the first inter-layer dielectric has a thickness, and the upper contact plug extends into the first inter-layer dielectric for a depth, and wherein a ratio of the depth to the thickness is in a range between about 0.1 and about 0.5. In an embodiment, the integrated circuit structure further comprises germanium in an upper half of the second inter-layer dielectric.

In accordance with some embodiments of the present disclosure, an integrated circuit structure comprises a semiconductor region; a source/drain region extending into the semiconductor region; a first inter-layer dielectric over the source/drain region; a first source/drain contact plug over and electrically coupling to the source/drain region, wherein the first source/drain contact plug comprises a metal region; a metal nitride layer with a first portion encircling the metal region; and a metal layer with a second portion encircling the metal nitride layer; and a second source/drain contact plug comprising a first sidewall physically contacting a second sidewall of the metal region to form a vertical interface; and a bottom edge physically contacting top edges of the metal nitride layer and the metal layer. In an embodiment, the second source/drain contact plug is further in contact with a top surface of the first source/drain contact plug. In an embodiment, the second source/drain contact plug extends into the first inter-layer dielectric for a depth, and a ratio of the depth to a thickness of the first inter-layer dielectric is in a range between about 0.1 and about 0.5. In an embodiment, the integrated circuit structure further comprises an etch stop layer over the first inter-layer dielectric; and a second inter-layer dielectric over the etch stop layer, wherein the second source/drain contact plug further extends into the etch stop layer and the second inter-layer dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a source/drain region for a transistor;
    forming a first inter-layer dielectric over the source/drain region;
    forming a lower source/drain contact plug over and electrically coupling to the source/drain region, wherein the lower source/drain contact plug extends into the first inter-layer dielectric, and wherein the lower source/drain contact plug comprises:
        a diffusion barrier; and
        a metallic material on the diffusion barrier;
    depositing an etch stop layer over the first inter-layer dielectric and the lower source/drain contact plug;
    depositing a second inter-layer dielectric over the etch stop layer;
    performing an etching process to etch the second inter-layer dielectric, the etch stop layer, and an upper portion of the first inter-layer dielectric to form an opening, with a top surface and a sidewall of the lower source/drain contact plug being exposed to the opening, wherein during the etching process, a portion of the diffusion barrier is etched to expose a vertical sidewall of the metallic material; and
    forming an upper contact plug in the opening.

2. The method of claim 1, wherein the etch stop layer and the upper portion of the first inter-layer dielectric are etched using process gases comprising a fluorine-and-carbon-containing gas.

3. The method of claim 2, wherein the diffusion barrier is also etched using the process gases comprising the fluorine-and-carbon-containing gas and $H_2O$.

4. The method of claim 1, further comprising, after the upper contact plug is formed, performing an implantation process to implant the second inter-layer dielectric.

5. The method of claim 4, wherein the implantation process is performed using a dopant comprising Ge, Xe, Ar, Si, or combinations thereof.

6. The method of claim 1, wherein the first inter-layer dielectric has a thickness, and the opening extends into the first inter-layer dielectric for a depth, and wherein a ratio of the depth to the thickness is in a range between about 0.1 and about 0.5.

7. The method of claim 1, wherein the second inter-layer dielectric and the upper portion of the first inter-layer dielectric are etched using a same etching mask.

8. The method of claim 1, further comprising:
    forming a gate stack, wherein the gate stack and the source/drain region are neighboring each other; and
    forming a gate contact plug, wherein the gate contact plug is aligned to a vertical middle line of the gate stack with the upper contact plug contacting the sidewall of the lower source/drain contact plug.

9. The method of claim 1 further comprising etching a vertical metal layer contacting the diffusion barrier during the etching process, wherein before the etching process, the vertical metal layer and the metallic material contact opposite sidewalls of the portion of the diffusion barrier.

10. An integrated circuit structure comprising:
    a gate stack over a semiconductor region;
    a source/drain region on a side of the gate stack;
    a source/drain silicide region over the source/drain region;
    a first inter-layer dielectric over the source/drain silicide region;
    a lower source/drain contact plug over and contacting the source/drain silicide region, wherein the lower source/drain contact plug comprises:
        a diffusion barrier comprising a first portion and a second portion, wherein a first top end of the first portion is lower than a second top end of the second portion; and
        a metallic material between the first portion and the second portion of the diffusion barrier;
    an etch stop layer over the first inter-layer dielectric and the lower source/drain contact plug;
    a second inter-layer dielectric over the etch stop layer; and
    an upper source/drain contact plug penetrating through the second inter-layer dielectric and the etch stop layer, and extending into an upper portion of the first inter-layer dielectric, wherein a first sidewall of the upper source/drain contact plug contacts a second sidewall of the metallic material, and a bottom surface of the upper source/drain contact plug contacts the first top end of the diffusion barrier.

11. The integrated circuit structure of claim 10, wherein the diffusion barrier comprises titanium nitride, and the metallic material comprises a material selected from tungsten, cobalt, and combinations thereof.

12. The integrated circuit structure of claim 10, further comprising a gate contact plug over and contacting the gate stack, wherein middle lines of the gate contact plug and the gate stack are vertically aligned.

13. The integrated circuit structure of claim 10, wherein a third sidewall of the upper source/drain contact plug contacts a fourth sidewall of the lower source/drain contact plug, and wherein the second sidewall and the fourth sidewall are opposing sidewalls of the lower source/drain contact plug.

14. The integrated circuit structure of claim 10, wherein the first inter-layer dielectric has a thickness, and the upper source/drain contact plug extends into the first inter-layer dielectric for a depth, and wherein a ratio of the depth to the thickness is in a range between about 0.1 and about 0.5.

15. The integrated circuit structure of claim 10, further comprising germanium in an upper half of the second inter-layer dielectric.

16. The integrated circuit structure of claim 10 further comprising a vertical metal layer on an opposite side of the diffusion barrier than the metallic material, wherein the vertical metal layer comprises a third top end lower than the second top end, with the third top end contacting the bottom surface of the upper source/drain contact plug.

17. An integrated circuit structure comprising:
a semiconductor region;
a source/drain region extending into the semiconductor region;
a first inter-layer dielectric over the source/drain region;
a first source/drain contact plug over and electrically coupling to the source/drain region, wherein the first source/drain contact plug comprises:
  a metal region;
  a metal nitride layer with a first portion encircling the metal region; and
  a metal layer with a second portion encircling the metal nitride layer; and
a second source/drain contact plug comprising:
  a first sidewall physically contacting a second sidewall of the metal region to form a vertical interface;
  a first bottom surface contacting a first top surface of the first source/drain contact plug; and
  a second bottom surface contacting a second top surface of the first source/drain contact plug, wherein the second bottom surface is lower than the first bottom surface, and wherein the first sidewall connects the first bottom surface to the second bottom surface.

18. The integrated circuit structure of claim 17, wherein the second source/drain contact plug extends into the first inter-layer dielectric for a depth, and a ratio of the depth to a thickness of the first inter-layer dielectric is in a range between about 0.1 and about 0.5.

19. The integrated circuit structure of claim 17, further comprising:
an etch stop layer over the first inter-layer dielectric; and
a second inter-layer dielectric over the etch stop layer, wherein the second source/drain contact plug further extends into the etch stop layer and the second inter-layer dielectric.

20. The integrated circuit structure of claim 17, wherein the second bottom surface extends to a sidewall of the first source/drain contact plug.

* * * * *